United States Patent
Chung et al.

(10) Patent No.: US 12,433,003 B2
(45) Date of Patent: Sep. 30, 2025

(54) 2D-CHANNEL TRANSISTOR STRUCTURE WITH ASYMMETRIC SUBSTRATE CONTACTS

(71) Applicant: Taiwan Semiconductor Manufacturing Company, Ltd., Hsin-Chu (TW)

(72) Inventors: Cheng-Ting Chung, Hsinchu (TW); Chien-Hong Chen, Hsinchu County (TW); Mahaveer Sathaiya Dhanyakumar, Hsinchu (TW); Hou-Yu Chen, Hsinchu County (TW); Jin Cai, Hsinchu (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 770 days.

(21) Appl. No.: 17/527,723

(22) Filed: Nov. 16, 2021

(65) Prior Publication Data
US 2022/0254890 A1    Aug. 11, 2022

Related U.S. Application Data

(60) Provisional application No. 63/147,193, filed on Feb. 8, 2021.

(51) Int. Cl.
*H10D 64/23* (2025.01)
*H01L 21/768* (2006.01)
(Continued)

(52) U.S. Cl.
CPC ..... *H10D 64/259* (2025.01); *H01L 21/76897* (2013.01); *H01L 23/5226* (2013.01);
(Continued)

(58) Field of Classification Search
CPC ......... H01L 29/41783; H01L 21/76897; H01L 23/5226; H01L 23/5283; H01L 29/401;
(Continued)

(56) References Cited

U.S. PATENT DOCUMENTS 9,520,362 B2    12/2016 Lin et al.
9,613,856 B1    4/2017 Yang et al.
(Continued)

FOREIGN PATENT DOCUMENTS

TW    201017879 A    5/2010

*Primary Examiner* — Jonathan Han
(74) *Attorney, Agent, or Firm* — HAYNES AND BOONE, LLP

(57) ABSTRACT

Semiconductor devices and methods of forming the same are provided. A method includes providing a workpiece having a semiconductor structure; depositing a two-dimensional (2D) material layer over the semiconductor structure; forming a source feature and a drain feature electrically connected to the semiconductor structure and the 2D material layer, wherein the source feature and drain feature include a semiconductor material; and forming a gate structure over the two-dimensional material layer and interposed between the source feature and the drain feature. The gate structure, the source feature, the drain feature, the semiconductor structure and the 2D material layer are configured to form a field-effect transistor. The semiconductor structure and the 2D material layer function, respectively, as a first channel and a second channel between the source feature and the drain feature.

20 Claims, 22 Drawing Sheets

(51) Int. Cl.
  *H01L 23/522* (2006.01)
  *H01L 23/528* (2006.01)
  *H10D 64/01* (2025.01)
  *H10K 10/46* (2023.01)
  *H10K 10/84* (2023.01)
  *H10K 85/20* (2023.01)

(52) U.S. Cl.
  CPC ......... *H01L 23/5283* (2013.01); *H10D 64/01* (2025.01); *H10K 10/484* (2023.02); *H10K 10/84* (2023.02); *H10K 85/221* (2023.02)

(58) Field of Classification Search
  CPC ............... H01L 29/24; H01L 29/66969; H01L 29/1606; H01L 29/778; H01L 27/092; H01L 21/8256; H01L 29/78; H10K 10/484; H10K 10/84; H10K 85/221; H10K 10/468; H10K 10/491; B82Y 10/00; H10D 64/259; H10D 64/01; H10D 30/47; H10D 62/80; H10D 99/00; H10D 62/882; H10D 30/60; H10D 84/02; H10D 84/85

See application file for complete search history.

(56) References Cited

U.S. PATENT DOCUMENTS

| | | |
|---|---|---|
| 9,716,032 B2 | 7/2017 | Tang et al. |
| 9,972,529 B2 | 5/2018 | Yang et al. |
| 10,163,691 B2 | 12/2018 | Shih et al. |
| 10,170,322 B1 | 1/2019 | Cheng et al. |
| 2014/0361381 A1 | 12/2014 | Hung et al. |
| 2016/0336183 A1 | 11/2016 | Yuan et al. |
| 2019/0287851 A1 | 9/2019 | Chen et al. |
| 2019/0304833 A1 | 10/2019 | Chen et al. |
| 2020/0013862 A1* | 1/2020 | Srivastava ........ H01L 29/66462 |
| 2020/0135912 A1 | 4/2020 | Tsai et al. |
| 2021/0118801 A1 | 4/2021 | Wang et al. |
| 2021/0126120 A1* | 4/2021 | Piedra ................. H01L 29/1608 |
| 2021/0305372 A1 | 9/2021 | Khaderbad et al. |

* cited by examiner

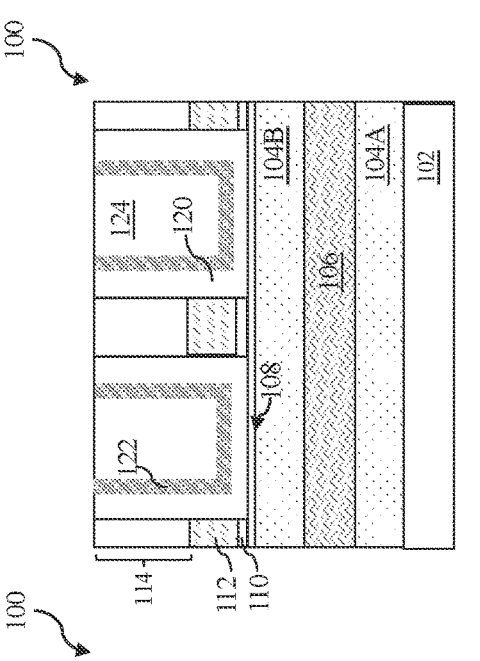
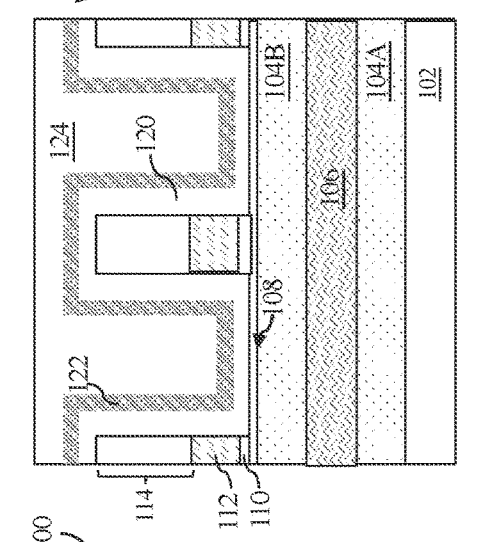
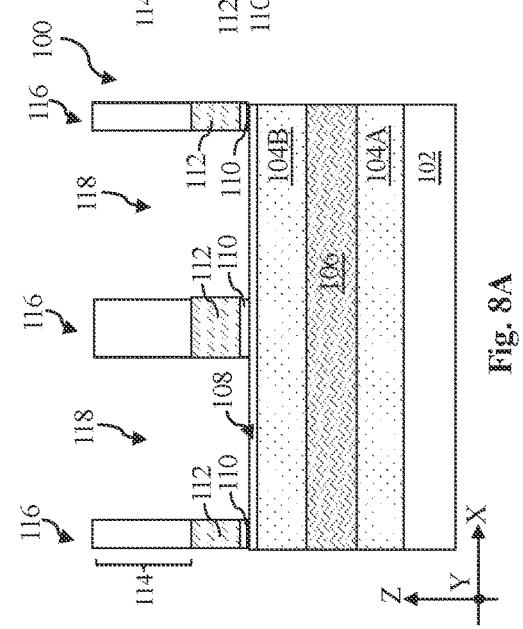
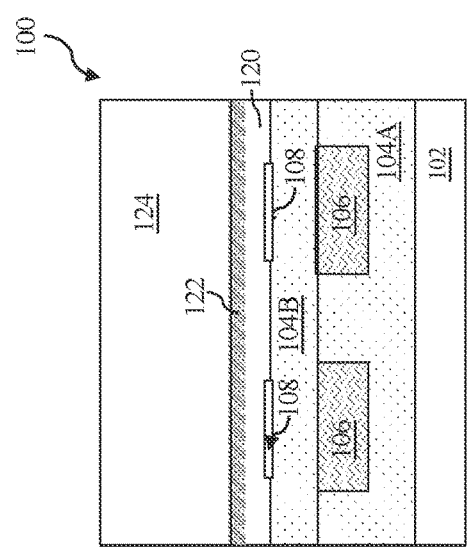
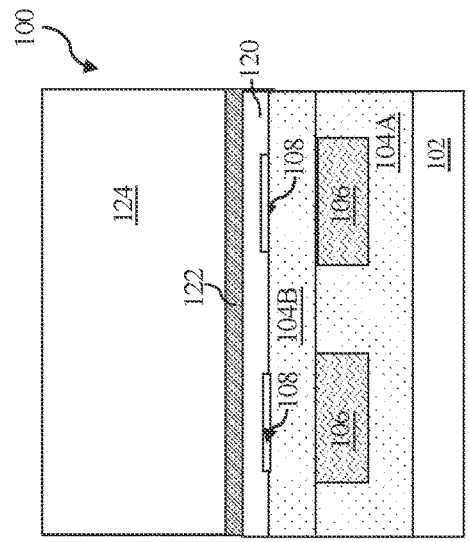
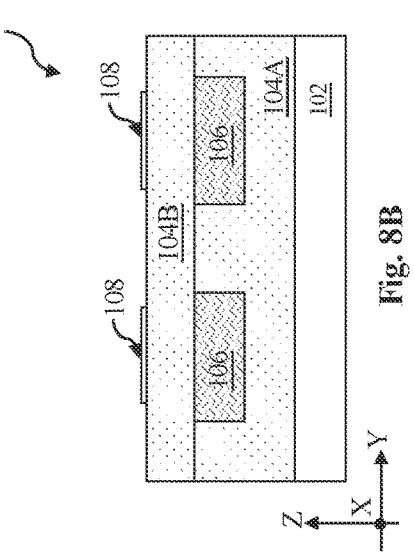
Fig. 8A  Fig. 8B
Fig. 9A  Fig. 9B
Fig. 10A  Fig. 10B

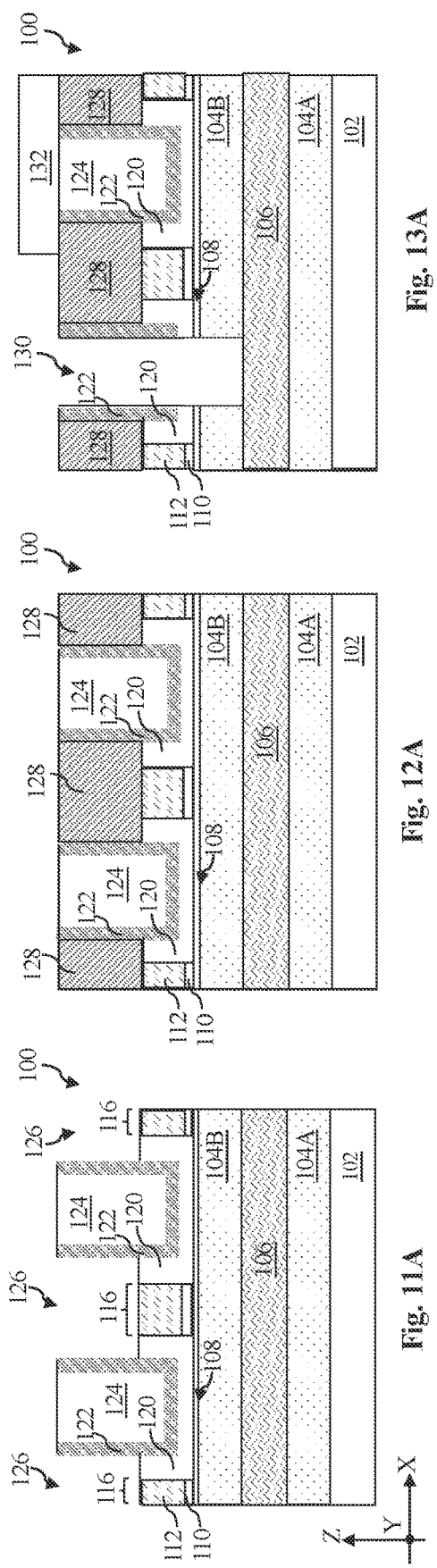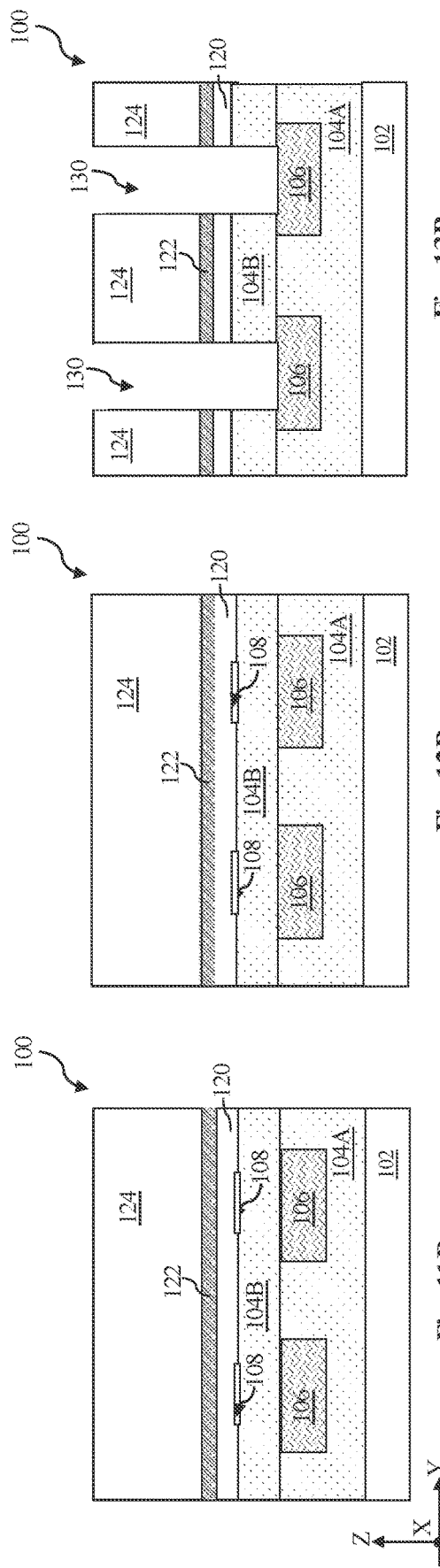

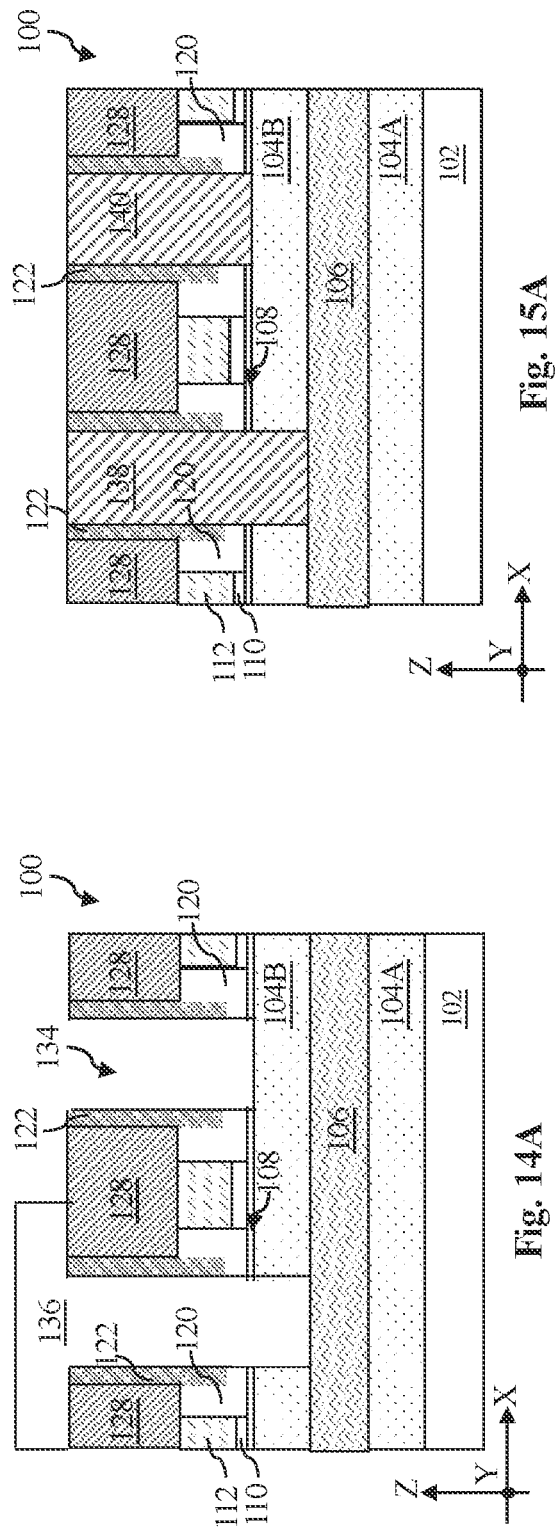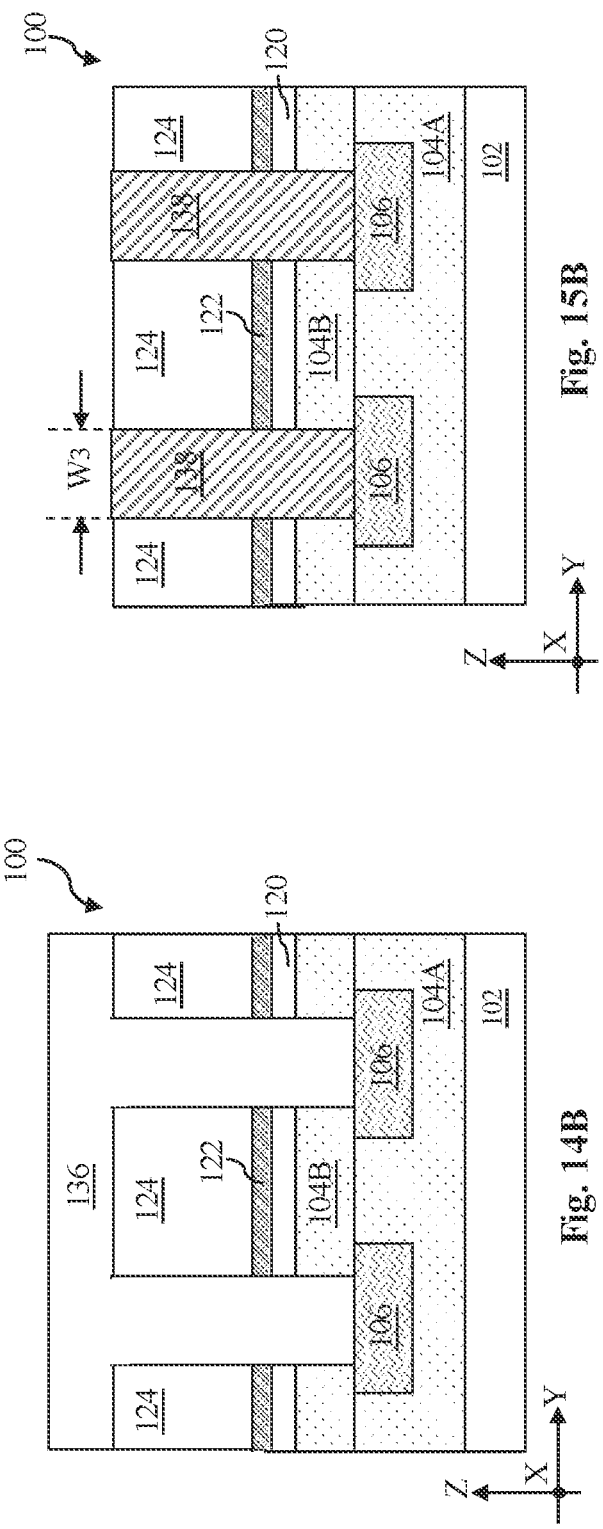

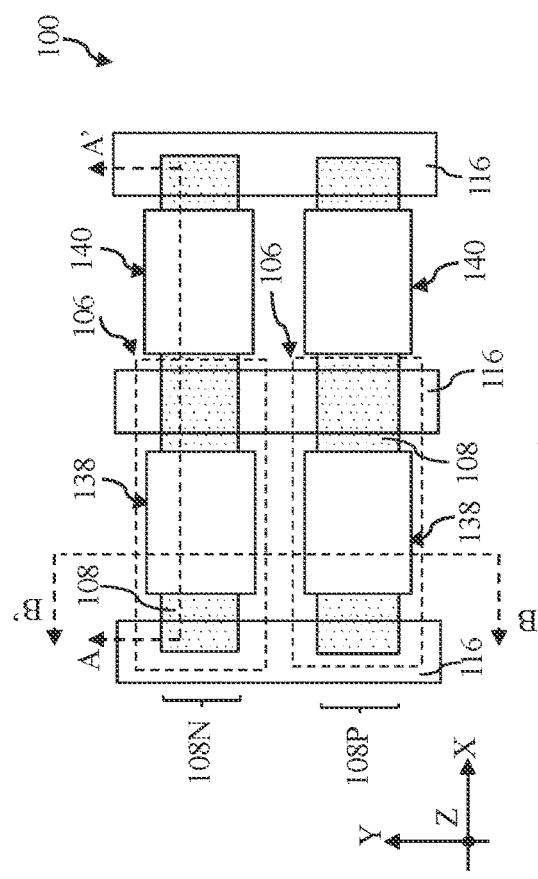
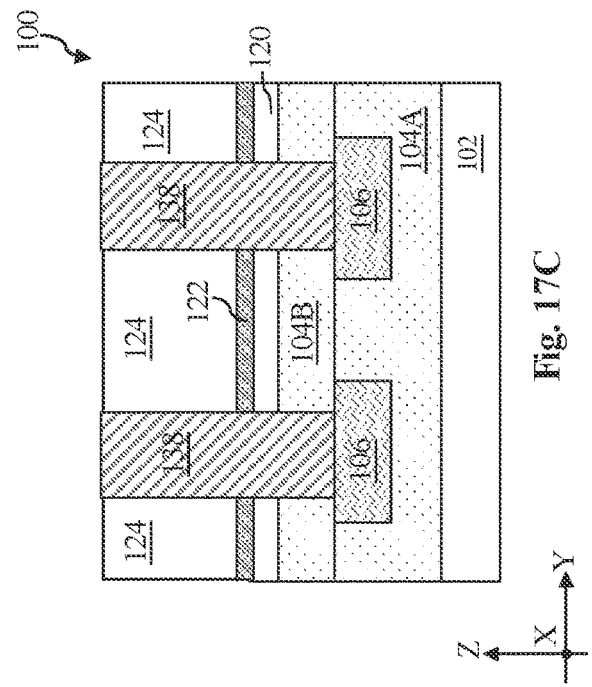
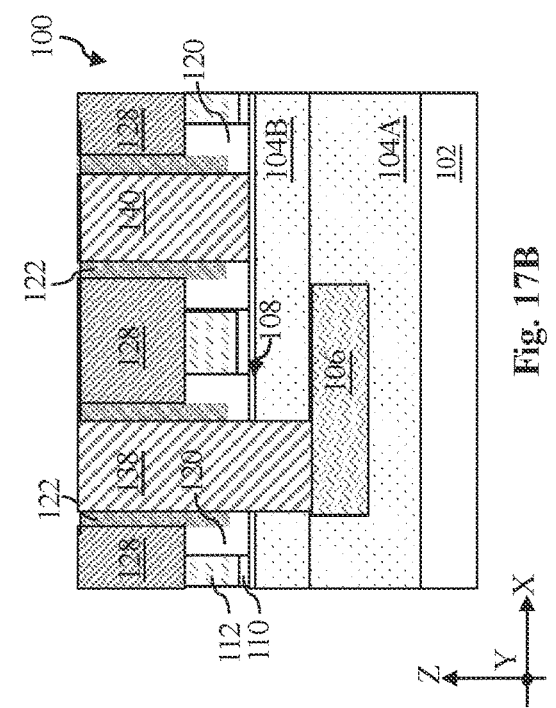
Fig. 17A
Fig. 17B
Fig. 17C

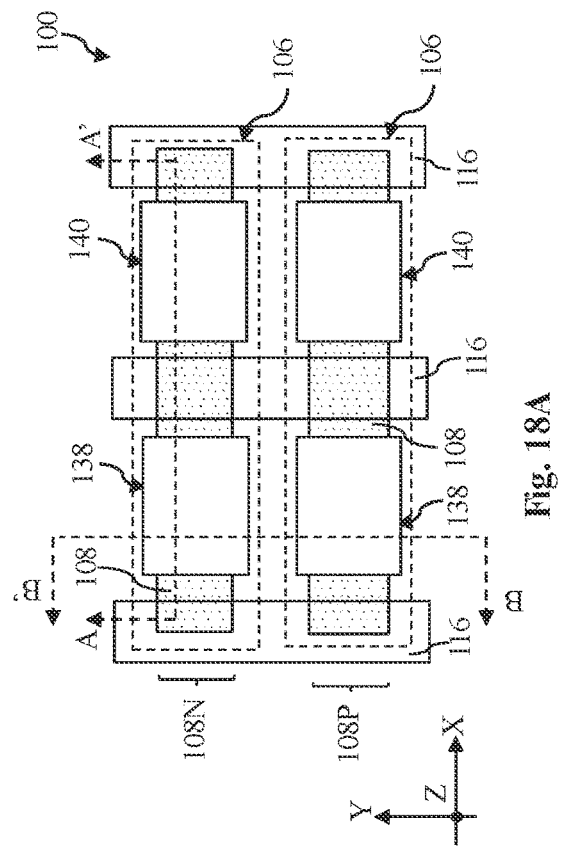
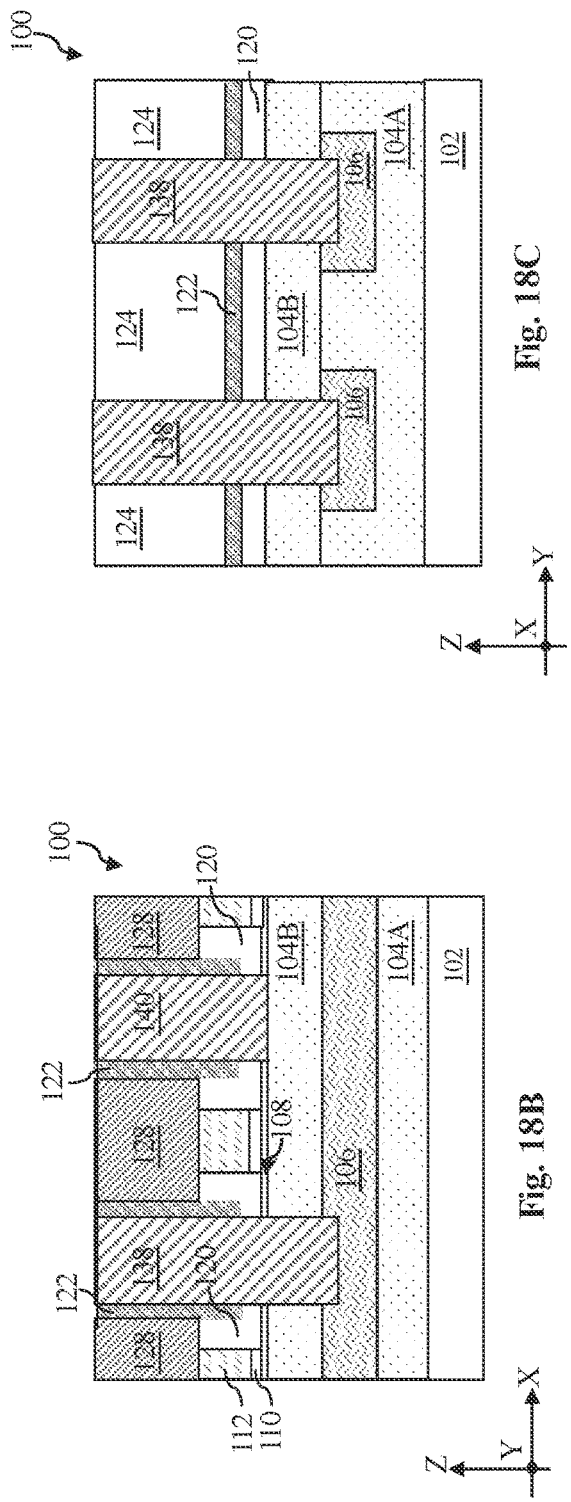
Fig. 18A
Fig. 18B
Fig. 18C

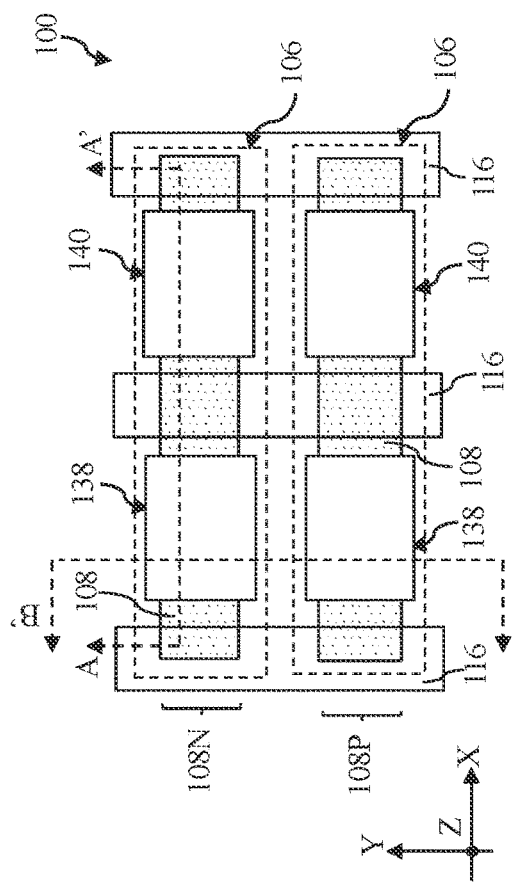
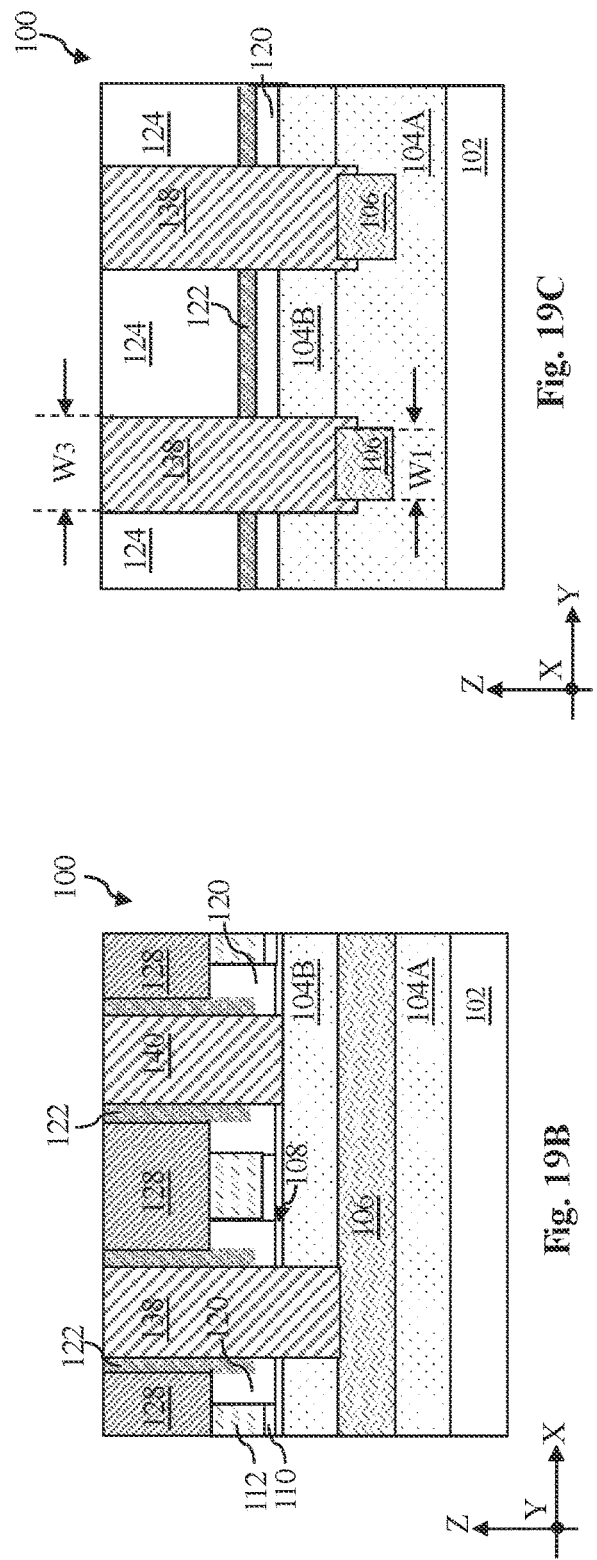
Fig. 19A
Fig. 19B
Fig. 19C

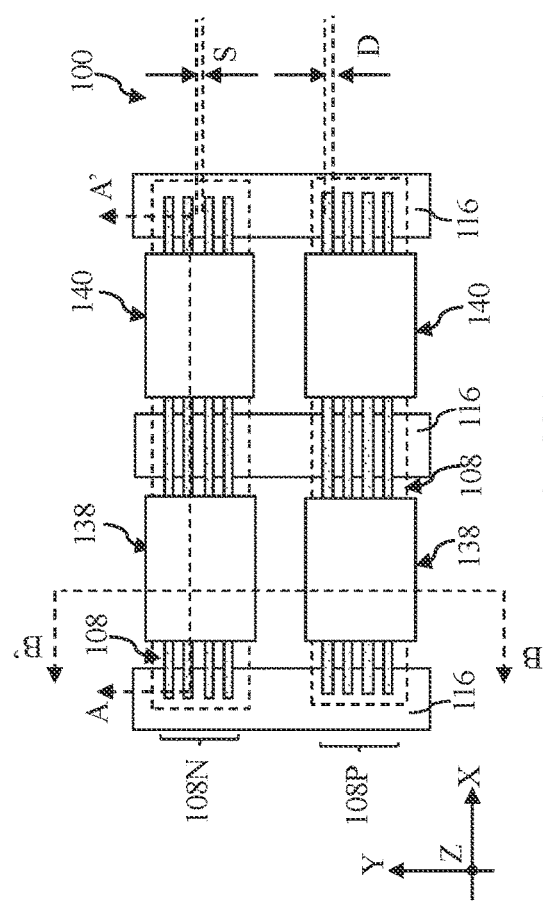
Fig. 20A
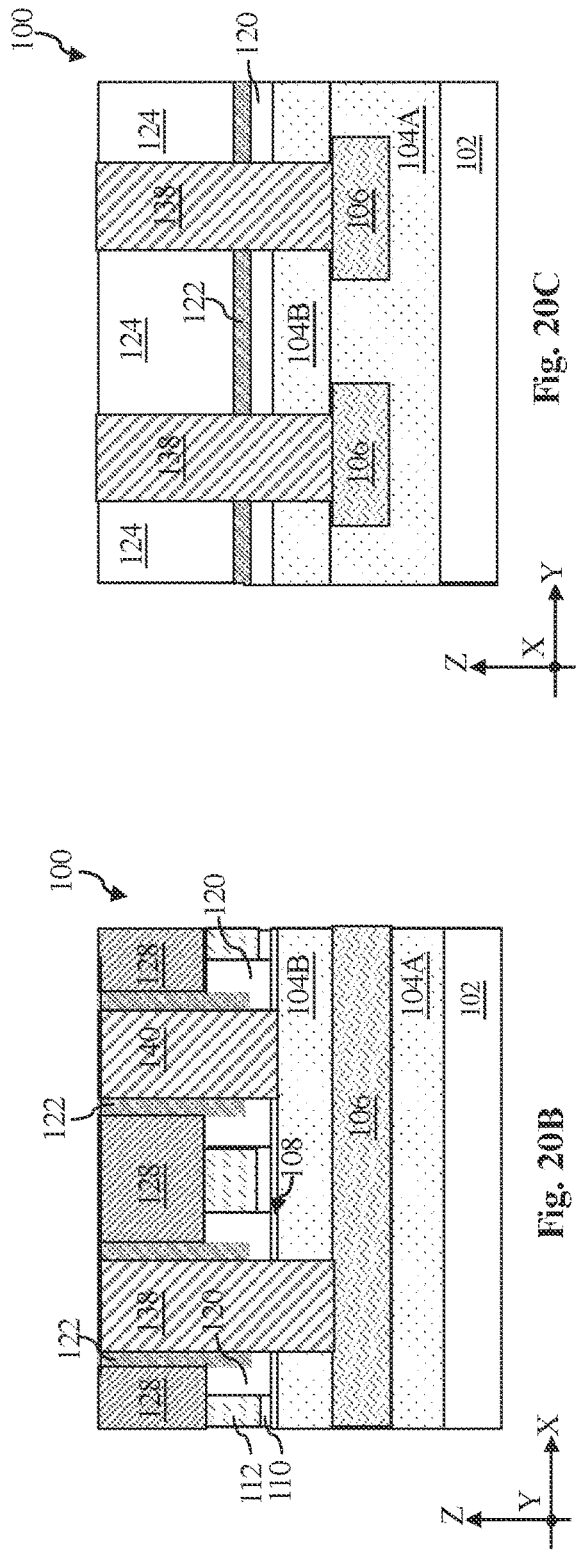
Fig. 20B
Fig. 20C

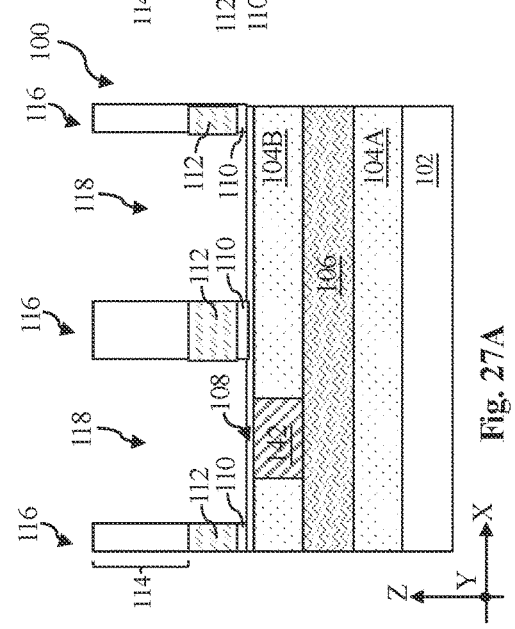
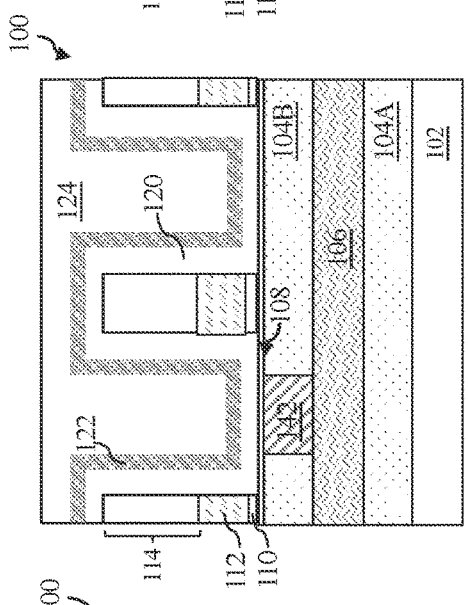
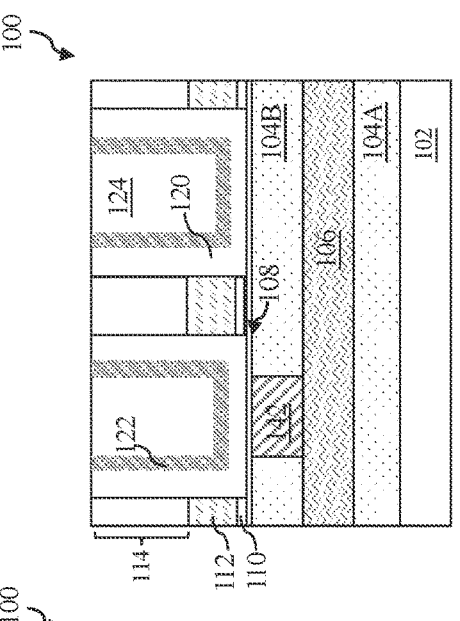
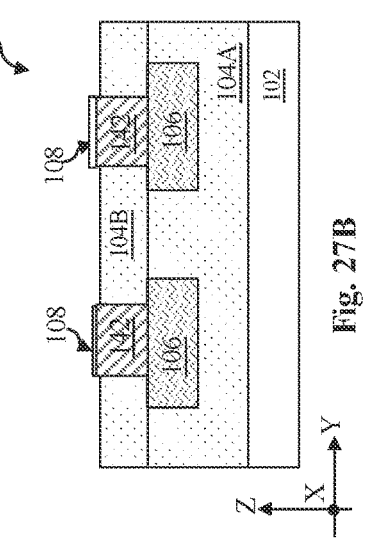
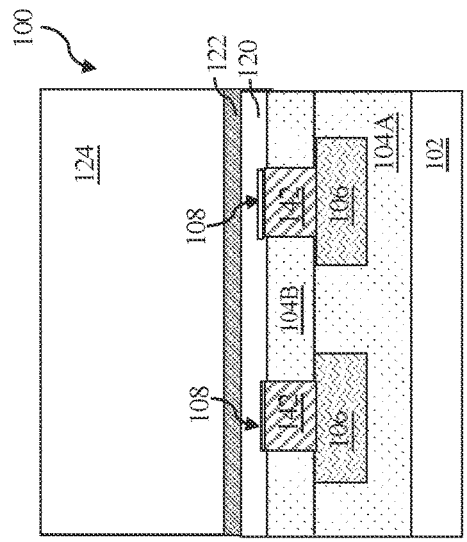
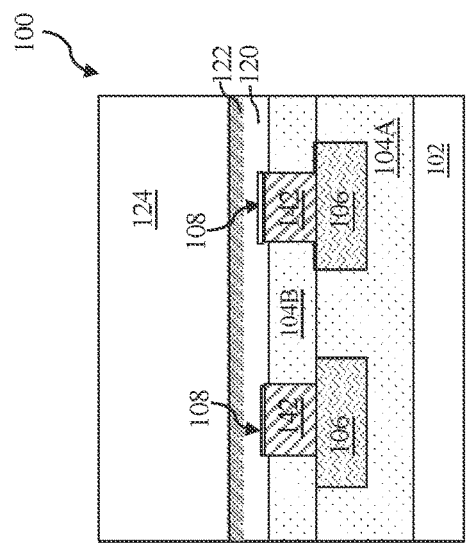
Fig. 27A  Fig. 28A  Fig. 29A
Fig. 27B  Fig. 28B  Fig. 29B

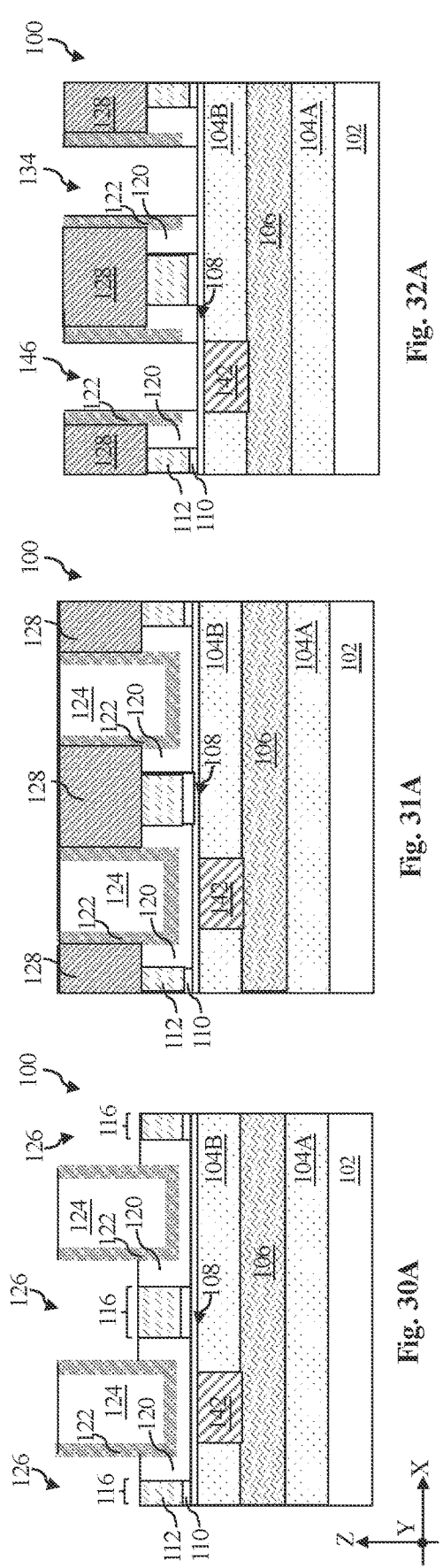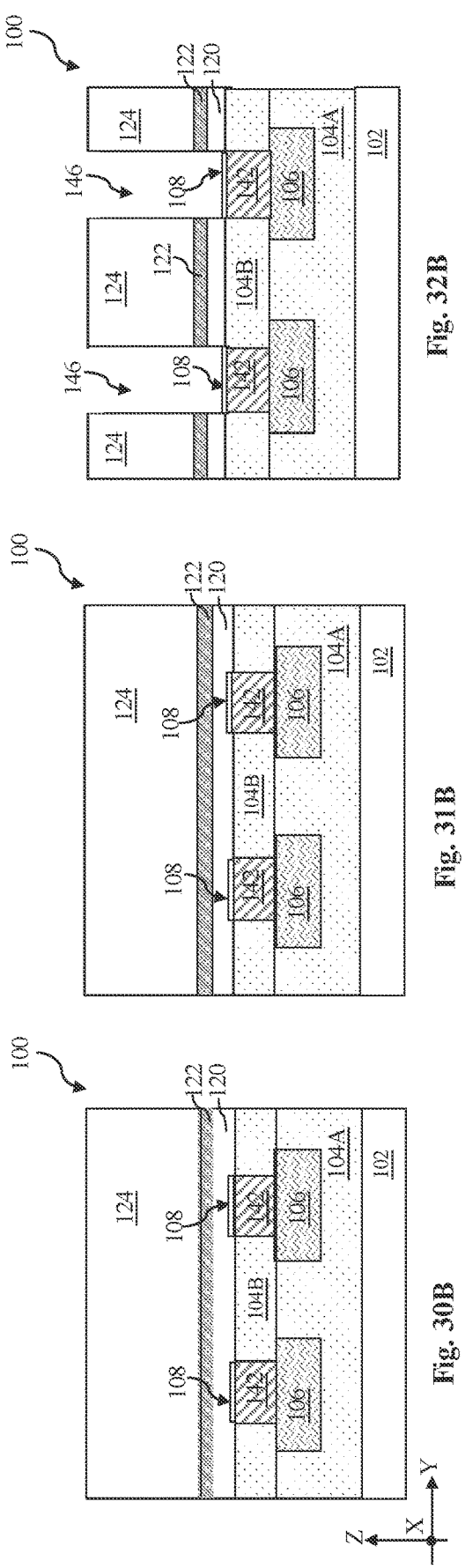

2D-CHANNEL TRANSISTOR STRUCTURE WITH ASYMMETRIC SUBSTRATE CONTACTS

PRIORITY DATA

This application claims priority to U.S. Provisional Patent Application No. 63/147,193 filed on Feb. 8, 2021, entitled "2D OR CNT-CHANNEL FIELD-EFFECT TRANSISTOR WITH CONTACT AND METHOD MAKING THE SAME", the entire disclosure of which is hereby incorporated herein by reference. This application is related to U.S. patent application Ser. No. 16/937,277 filed on Jul. 23, 2020, entitled "DUAL CHANNEL STRUCTURE", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, as integrated circuit (IC) technologies progress towards smaller technology nodes, multi-gate devices have been introduced to improve gate control by increasing gate-channel coupling and reducing off-state current. A multi-gate device generally refers to a device having a gate structure, or portion thereof, disposed over more than one side of a channel region. In some examples, two-dimensional material is used to form field-effect transistors. As the scaling down continues, multi-gate devices or FET devices with a two-dimensional material still face various challenges, such as short-channel effect (SCE), may not meet the design target and device performance. Therefore, while conventional two-dimensional structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-15A illustrate fragmentary cross-sectional views of a semiconductor device of FIG. 4 along AA' at various fabrication stages, according to one or more aspects of the present disclosure.

FIGS. 5B-15B illustrate fragmentary cross-sectional views of a semiconductor device of FIG. 4 along BB' at various fabrication stages, according to one or more aspects of the present disclosure.

FIG. 17A illustrates a fragmentary top view of a semiconductor device, according to one or more aspects of the present disclosure.

FIGS. 17B and 17C illustrate fragmentary cross-sectional views of a semiconductor device of FIG. 17A along AA' and BB', respectively, according to one or more aspects of the present disclosure.

FIG. 18A illustrates a fragmentary top view of a semiconductor device, according to one or more aspects of the present disclosure.

FIGS. 18B and 18C illustrate fragmentary cross-sectional views of a semiconductor device of FIG. 18A along AA' and BB', respectively, according to one or more aspects of the present disclosure.

FIG. 19A illustrates a fragmentary top view of a semiconductor device, according to one or more aspects of the present disclosure.

FIGS. 19B and 19C illustrate fragmentary cross-sectional views of a semiconductor device of FIG. 19A along AA' and BB', respectively, according to one or more aspects of the present disclosure.

FIG. 20A illustrates a fragmentary top view of a semiconductor device, according to one or more aspects of the present disclosure.

FIGS. 20B and 20C illustrate fragmentary cross-sectional views of a semiconductor device of FIG. 20A along AA' and BB', respectively, according to one or more aspects of the present disclosure.

FIGS. 24A-33A illustrate fragmentary cross-sectional views of a semiconductor device of FIG. 23 along AA' at various fabrication stages, according to one or more aspects of the present disclosure.

FIGS. 24B-33B illustrate fragmentary cross-sectional views of a semiconductor device of FIG. 23 along BB' at various fabrication stages, according to one or more aspects of the present disclosure.

DETAILED DESCRIPTION

Figure 1:
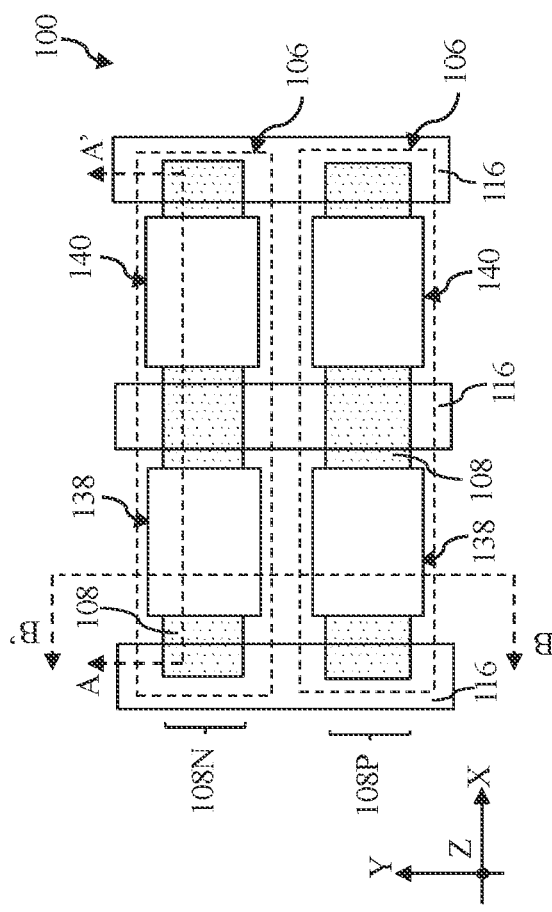
FIG. 1 illustrates a fragmentary top view of a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to field-effect transistor (FET) and fabrication methods, and more particularly to field-effect transistor having a channel layer formed of a two-dimensional (2D) material or carbon nanotube (CNT). In advanced semiconductor technologies, field-effect transistors face various challenges, such as short channel effect (SCE), such as short channel effect of a planar device may not meet the design target and device performance due to drain side coupling to the gate.

The disclosed FET structure is formed on a planar active region as a planar FET device, and alternatively is formed on a three-dimensional (3D) structure, such as multi-gate FET devices. Examples of multi-gate devices include fin-like field effect transistors (FinFETs) having fin-like structures and multi-bridge-channel (MBC). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor having a plurality of channel members vertically stacked.

The present disclosure provides embodiments of a semiconductor device whose channel layer is formed of a 2D material or CNT, collectively referred to as 2D FET device. A 2D FET may be a planar device, a FinFET, or an MBC transistor. Embodiments in a planar FET structure are illustrated and described herein.

Figure 2B:
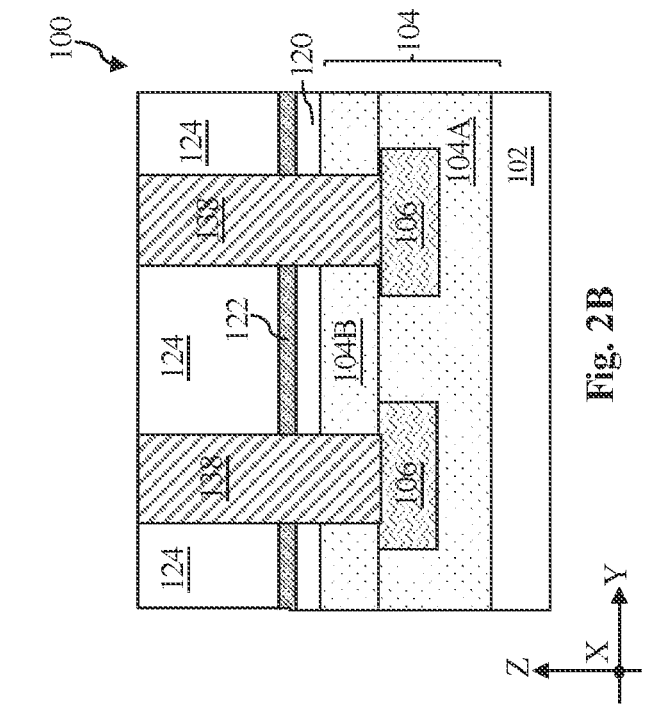
FIGS. 2A and 2B illustrate fragmentary cross-sectional views of a semiconductor device of FIG. 1 along AA' and BB', respectively, according to one or more aspects of the present disclosure.
Figure 2A:
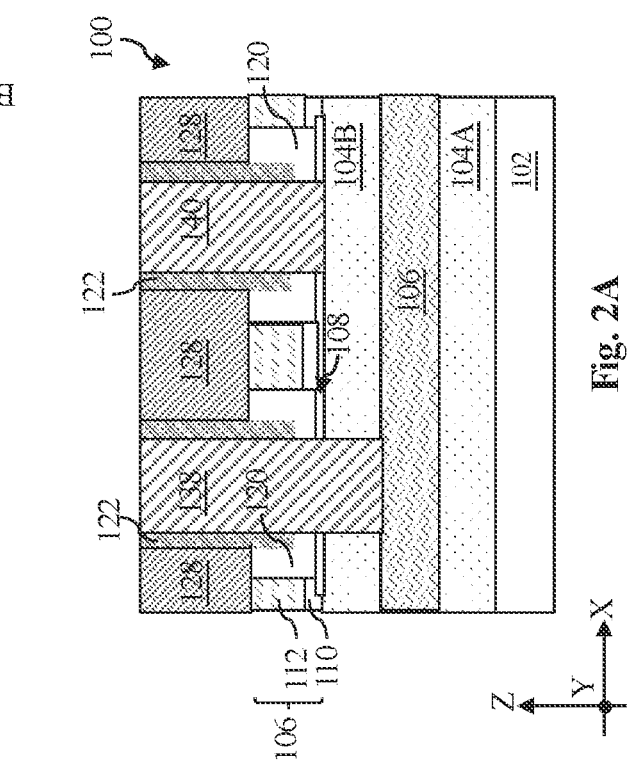

The various aspects of the present disclosure will now be described in more detail with reference to the following figures. FIG. 1 illustrates a top view of a semiconductor device 100, and FIGS. 2A and 2B illustrates cross-sectional views of the semiconductor device 100 of FIG. 1 along AA' and BB', respectively, constructed according to various embodiments. The semiconductor device 100 is a planar FET in the present embodiment, and alternatively may be a FinFET or an MBC transistor.

As the semiconductor device 100 is formed from a workpiece, it may be referred to as a workpiece 100 as the context requires. As shown in FIG. 1, the semiconductor device 100 includes a substrate 102. In one embodiment, the substrate 102 may be a silicon substrate. In some other embodiments, the substrate 102 may include other semiconductors such as germanium (Ge), silicon germanium (SiGe), a III-V semiconductor material, or a II-VI semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Example II-VI semiconductor materials may include cadmium selenide (CdSe), cadmium sulfide (CdS), cadmium telluride (CdTe), zinc selenide (ZnSe), zinc sulfide (ZnS), and zinc telluride (ZnTe).

The semiconductor device 100 includes a first dielectric film 104A and a second dielectric film 104B disposed on the first dielectric film 104A. The dielectric films 104A and 104B are also collectively referred to as a dielectric layer 104. The dielectric films 104A and 104B are deposited by suitable processes, such as chemical vapor deposition (CVD), atomic layer deposition (ALD), other suitable method or a combination thereof. Each of the dielectric films 104A and 104B includes silicon oxide ($SiO_2$), silicon nitride (SiN), silicon oxynitride (SiON), silicon carbon nitride (SiCN), silicon carbon oxynitride (SiOCN), other suitable dielectric material, or a combination thereof. In some embodiments, the first dielectric film 104A includes a thickness ranging between 10 nm and 100 nm, and the second dielectric film 104B includes a thickness ranging between 5 nm and 30 nm.

The semiconductor device 100 includes metal features 106 embedded in the dielectric layer 104, therefore also referred to as substrate contacts. The metal features 106 are longitudinally oriented along X direction. The dielectric layer 104 and the metal features 106 may be formed by a suitable procedure that includes depositing the first dielectric film 104A; forming the metal features 106; and depositing the second dielectric film 104B. The procedure may further include a chemical-mechanical polishing (CMP) process to planarize the top surface after the deposition of the second dielectric film 104B. The method of forming the metal features 106 may include a suitable technique, such as a damascene process, or alternatively metal deposition followed by metal patterning by lithography process and etching. In some embodiments, the damascene process to form the metal features 106 includes patterning the first dielectric film 104A to form trenches; depositing a metal or a metal-containing conductive material in the trenches; and performing a CMP process to remove the excessive metal and planarize the surface. The deposition includes physical vapor deposition (PVD), plating, other suitable deposition or a combination thereof. The patterning may include lithography process and etching. The lithography process further includes photoresist coating, exposure, and developing to form a patterned photoresist layer, and may further includes one or more baking processes. In an alternative embodiment, the metal features 106 may be formed by deposition and patterning. In this case, the metal features 106 are embedded in the second dielectric film 104B. The metal features 106 include metal or metal alloy, such as tungsten (W) cobalt (Co), nickel (Ni), ruthenium (Ru), titanium nitride (TiN), titanium (Ti), tantalum nitride (TaN), tantalum (Ta), copper (Cu), aluminum (Al), molybdenum (Mo), other suitable metal, metal-containing conductive material (such as metal alloy), or a combination thereof. In some examples, the metal features 106 includes a single metal, such as Ni, Ru, or Co. In some examples, the metal features 106 includes a metal-containing conductive material, such as CuAl alloy. In some examples, the metal features 106 includes a multi-layer structure, such as a barrier layer and a bulky metal or metal-containing conductive material on the barrier layer. In furtherance of the examples, the barrier layer includes Ti/TiN or Ta/TaN while the bulky metal or metal-containing conductive material includes W, Cu, Al, or CuAl alloy. The barrier layer prevents the metal from diffusing into the dielectric films. In some embodiments, the metal features 106 include a thickness ranging between 5 nm and 30 nm. Other dimensions and configurations of the metal features 106 will be further described later.

The semiconductor device 100 includes a channel layer 108 disposed on the second dielectric film 104B. The channel layer 108 is formed of a two-dimensional (2D) material or carbon nanotube (CNT), collectively referred to as 2D channel layer (or simply channel layer) 108. It is noted that the channel layer 108 are not visible in FIG. 1 due to presence of other structures. Particularly, the 2D channel layer 108 is patterned to form various channel members, such as 108N and 108P. The formation of the channel members includes deposition of a 2D channel material; and patterning the 2D channel material to form channel members 108N and 108P, collectively referred to as the 2D channel layer 108. The metal features 106 are embedded in the dielectric layer 104 and are aligned with the overlying channel members (108N and 108P). According to the present disclosure, a 2D material refers to a semiconductor material that is very thin and may have only a single-atomic layer, being referred to as a monolayer semiconductor material, or alternatively includes 1~5 monolayers with a thickness ranging between 0.5 nm and 5 nm. In some embodiments, the 2D material includes a 2D transition metal dichalcogenide (TMD), such as tungsten sulfide ($WS_2$), tungsten telluride ($WTe_2$), tungsten selenide ($WSe_2$), molybdenum sulfide ($MoS_2$), molybdenum telluride ($WTe_2$), molybdenum selenide ($MoSe_2$), hafnium sulfide ($HfS_2$), hafnium telluride ($HfTe_2$), hafnium selenide ($HfSe_2$), and etc. A 2D TMD material layer includes an atomically thin semiconductors of the type $MX_2$, with M a transition metal atom (Mo, W, Hf, etc.) and X a chalcogen atom (S, Se, or Te). One layer of M atoms is sandwiched between two layers of X atoms. For example, a $MoS_2$ monolayer is only 6.5 Å thick. In some embodiments, the 2D channel layer 108 includes a thickness ranging between 0.5 Å and 5 Å. In some alternative embodiments, the 2D channel layer 108 includes carbon nanotube (CNT). In some embodiments, the channel layer 108 includes other suitable 2D material, such as black phosphorus, or graphene. the 2D material layer may be undoped or alternatively doped with a dopant, such as sulfur(S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). In some examples, the corresponding doping concentration ranges between $1\times10^8/cm^2$ and $1\times10^{12}/cm^2$.

The 2D channel layer 108 is deposited and patterned to define the active regions. In the present embodiment, as illustrated in FIG. 1, the channel layer 108 includes a first channel member 108N and a second channel member 108P longitudinally oriented in a first direction (X direction). In furtherance of the embodiment, the first channel member 108N is configured to form one or more n-type FET (nFET) and the second channel member 108P is configured to form one or more p-type FET (pFET). In some embodiments, different 2D material are used for nFET and pFET to achieve higher driving currents, respectively. For example, $MoS_2$ has high electron mobility but low hole mobility; on the contrary, $WSe_2$ has high hole mobility. Therefore, $MoS_2$ and $WSe_2$ can be used as nFET and pFET channel, respectively. In this case, the 2D channel layers for nFET and pFET are respectively deposited and patterned to form corresponding 2D channels for nFET and pFET.

The deposition of the 2D channel layer includes any suitable method, such as epitaxial growth, chemical vapor deposition (CVD), atomic layer deposition (ALD), or a combination thereof. The patterning process includes a lithography process and etching. In some embodiments, the 2D channel layer is formed by other suitable technologies, such as a transfer method. In the transfer method, a 2D material layer is grown by CVD method on a sapphire substrate to get better quality. Thereafter, the 2D material layer is transferred to a silicon substrate with a $SiO_2$ top layer.

The semiconductor device 100 includes a gate structure having one or more gate stacks 116 disposed on the channel members 108N and 108P and longitudinally oriented in a second direction (Y direction), which is orthogonal or substantially orthogonal to the first direction (X direction). In the described embodiment, the gate structure includes a left edge gate stack 116 disposed on left edges and a right edge gate stack 116 disposed on right edges of the channel members 108N and 108P and further includes a middle gate stack 116 interposed between the left and right edge gate stacks 116. In furtherance of the embodiment, the middle gate stack 116 is a functional gate stack to form various FETs, such as a nFET associated with the first channel member 108N and the middle gate stack 116 and a pFET associated with the second channel member 108P and the middle gate stack 116. In the present embodiment, there is only one middle gate stack 116 between the left and right gate stacks 116 for illustration. However, it is not intended to be limiting and more than one functional gate stacks 116 may be interposed between the left and right edge gate stacks 116 to form multiple FETs.

The left and right edge gate stacks 116 are dummy gate stacks designed to provide uniform gate pattern density for increased fabrication capability and to eliminate the edge effect, thereby enhancing uniform device performance to various FETs. Here the edge effect refers to the phenomena of FETs performance variation from the middle to the edges due to different environments. Each of the left and right edge gate stacks 116 is partially disposed on the 2D channel layer and extends from the 2D channel layer 108 (e.g., channel members 108N and 108P) to the second dielectric film 104B along the first direction.

The gate stacks 116 includes a gate dielectric layer 110; and a gate electrode 112 on the gate dielectric layer 110. The gate structure further includes a gate spacer 120 is further disposed on both sidewalls of the gate stacks 116. The formation of the gate stacks 116 includes deposition of the gate materials including a dielectric layer and a conductive layer; and patterning the gate materials to form gate stacks 116. The patterning process includes a lithography process and etching. The gate spacer includes deposition of one or more dielectric material films on the gate stacks 116 and performing an anisotropic etching process, such as plasma etching.

The gate dielectric layer 110 includes one or more dielectric material, such as a high-k dielectric material layer with a dielectric constant greater than that of thermal silicon oxide, such as hafnium oxide ($HfO_2$), hafnium silicon oxide ($HfSiO_2$), zirconium oxide ($ZrO_2$) or a combination thereof. Alternatively, the gate dielectric layer 110 includes an interfacial layer and a high-k dielectric material layer disposed on the interfacial layer. In various embodiments, the interfacial layer includes silicon oxide, silicon nitride (SiN), silicon oxynitride (SiON), aluminum oxide ($Al_2O_3$), hexagonal boron nitride (hBN) or a combination thereof. The gate electrode 112 includes one or more conductive material, such as tungsten (W), titanium nitride, titanium, tantalum nitride, tantalum, aluminum, other suitable conductive material or a combination thereof. The gate electrode 112 has a thickness ranging between 5 nm and 30 nm. The gate spacer 120 includes silicon oxide, silicon nitride, silicon oxynitride, silicon carbon nitride, (SiCN), silicon oxygen carbon nitride (SiOCN), or a combination thereof. The gate spacer 120 has a thickness ranging between 2 nm and 10 nm.

The semiconductor device 100 further includes a self-aligned cap (SAC) feature 128 disposed on the gate stacks 116. The SAC feature 128 is dielectric feature is self-aligned with the gate structure, especially self-aligned with the gate spacer 120 and constrained by a contact etch-stop layer (CESL) 122. The formation of the SAC feature 128 includes a suitable procedure. For example, the procedure includes depositing a SAC dielectric material in a recess over the gate stack and a CMP process is applied to remove the excessive SAC dielectric material. The SAC dielectric feature 128 includes one or more dielectric materials, such as silicon nitride, aluminum oxide, silicon carbide, hafnium oxide, zirconium oxide, or a combination thereof.

The semiconductor device 100 also includes the CESL 122 and inter-layer dielectric (ILD) layer 124 disposed on the CESL 122. The formation of the CESL 122 and the ILD layer 124 includes depositing a conformal CESL 122, such as by CVD or atomic layer deposition (ALD); depositing an ILD layer 124, such as by CVD, flowable CVD, other suitable deposition or a combination thereof; and performing a CMP process. The CESL 122 is different from the ILD layer 124 in composition to provide etch selectivity. The CESL 122 includes silicon oxide, silicon nitride, other suitable dielectric material, or a combination thereof. The CESL 122 has a thickness ranging between 2 nm and 10 nm. In some embodiments, the ILD layer 124 includes undoped silica glass (USG), phosphosilicate glass (PSG), boron-doped phosphosilicate glass (BPSG), borosilicate glass (BSG) or a combination thereof. In some embodiments, the ILD layer 124 includes a low-k dielectric material with a dielectric constant less that of the thermal silicon oxide, such as fluorinated silica glass (FSG), carbon doped silicon oxide, Black Diamond® (Applied Materials of Santa Clara, California), Xerogel, Aerogel, amorphous fluorinated carbon, Parylene, BCB (bis-benzocyclobutenes), SiLK (Dow Chemical, Midland, Michigan), polyimide, and/or other materials.

The semiconductor device 100 also includes a source contact feature (or simply source contact) 138 and a drain contact feature (or simply drain contact) 140 disposed on opposite sides of the gate stack 116 and configured to contact and electrically connect to the channel layer 108. The source contact 138 and the drain contact 140 are conductive features and include one or more conductive material, such as W, cobalt (Co), ruthenium (Ru), Ta, TaN, Ti, TiN, aluminum, molybdenum (Mo), silver (Ag), gold (Au), platinum (Pt), scandium (Sc), palladium (Pd), hafnium, other suitable metal, or a combination thereof.

The formation of the source contact 138 and the drain contact 140 include a suitable procedure, such as a damascene process. The damascene process further includes patterning the ILD layer (and the dielectric layer 104) to form a trench; filling the trench with the metal or other suitable conductive material in the trench; and performing a CMP process.

The source contact 138 and the drain contact 140 are configured differently. Particularly, the source contact 138 vertically extends to contact the metal feature 106 embedded in the dielectric layer 104 while the drain contact 140 vertically extends to the channel layer 108 and is separated from the metal feature 106 by the dielectric layer 104. In the described embodiment, the drain contact 140 extends through the channel layer 108 to reach the dielectric layer 104. In furtherance of the embodiment, the bottom surface of the drain contact 140 is coplanar with the bottom surface of the channel layer 108. Additionally, the bottom surface of the drain contact 140 is coplanar with the top surface of the dielectric layer 104. In some embodiments, the drain contact 140 is alternatively landing on the channel layer 108. In this case, the bottom surface of the drain contact 140 is coplanar with the top surface of the channel layer 108.

By utilizing the disclosed semiconductor device 100, the electric field coupling from the side of the drain contact 140 to the gate stack 116 is redistributed to the source contact or terminated due to the embedded metal feature 106 and its connection to the source contact 138, thereby reducing drain to gate coupling and improving short channel effect. The semiconductor device 100 also effectively prevents the channel leakage to the metal feature 106 since the metal feature 106 is embedded in the dielectric layer 104 and is isolated from the channel layer 108 by the dielectric layer 104.

Figure 3:
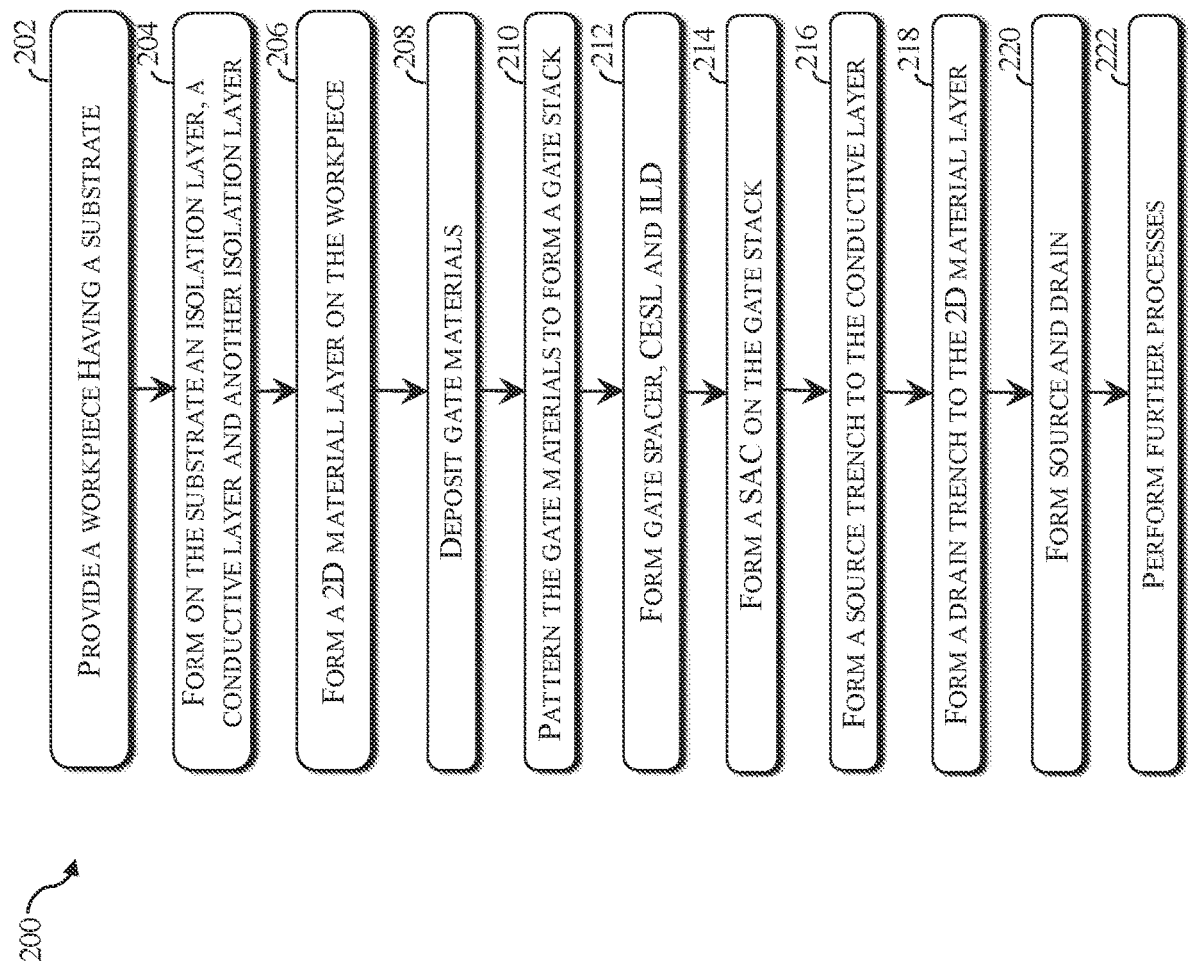
FIG. 3 illustrates a flowchart of a method of fabricating a semiconductor device, according to one or more aspects of the present disclosure.
Figure 4:
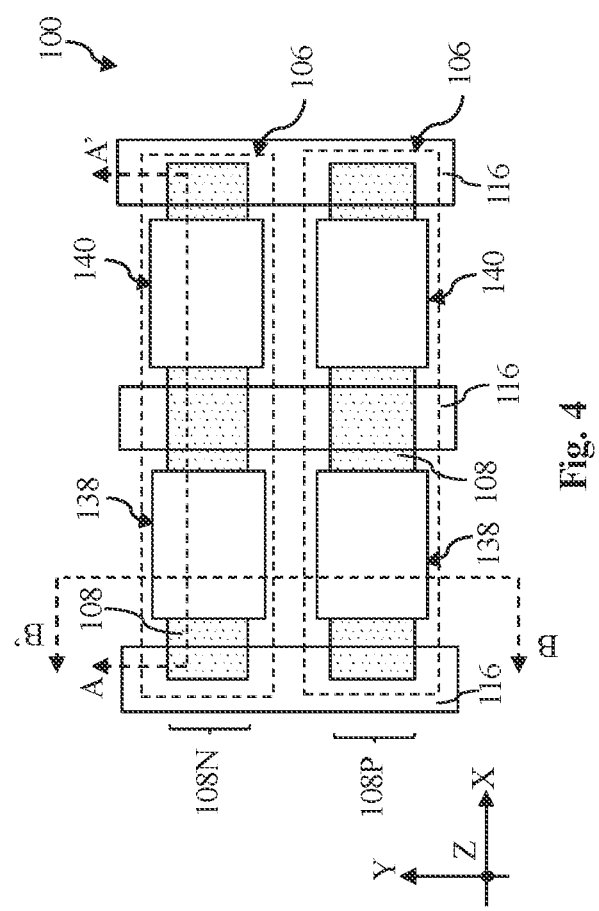
FIG. 4 illustrates a fragmentary top view of a semiconductor device, according to one or more aspects of the present disclosure.

The method to form the semiconductor device 100 is further described with reference to FIG. 3 and FIGS. 4 through 15B. FIG. 3 is a flowchart of a method 200; FIG. 4 is a top view of the semiconductor device 100; FIGS. 5A~15A are sectional views of the semiconductor device 100 cut along AA' of FIG. 4 at various fabrication stages; and FIGS. 5B~15B are sectional views of the semiconductor device 100 cut along BB' of FIG. 4 at various fabrication stages, constructed according to various embodiments.

Figure 5A:
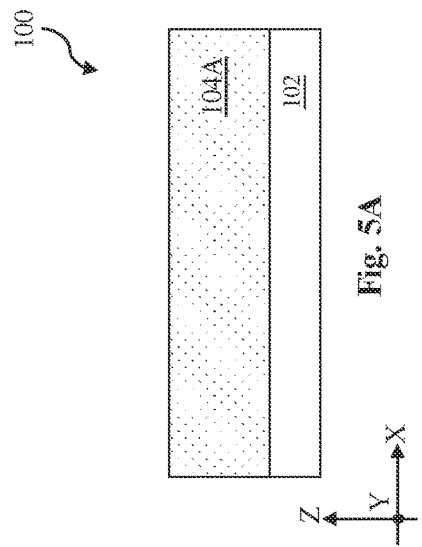
Figure 5B:
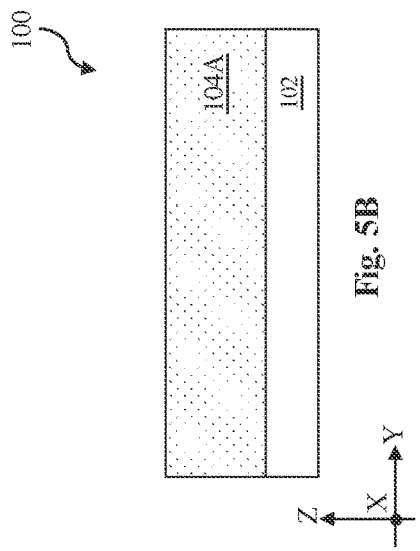

Referring to FIGS. 5A and 5B, the method 200 begins at the block 202 by providing a workpiece (or semiconductor device) 100 having a substrate 102.

Referring to FIGS. 5A, 5B, 6A and 6B, the method 200 includes an operation 204 by forming the dielectric layer 104 on the substrate 102 and the metal features 106 embedded in the dielectric layer 104. More particularly, the operation 204 includes depositing the first dielectric film 104A; forming the metal features 106; and forming the second dielectric film 104B on the first dielectric film 104A and the metal features 106. In some embodiments, the formation of the metal features 106 includes a damascene process that further includes patterning the first dielectric film 104A to form trenches; filling the trenches with conductive material(s) to form the metal features 106; and performing a CMP process. The metal features 106 are longitudinally oriented along the X direction and are spanned with a width $W_1$ along the Y direction.

Figure 7A:
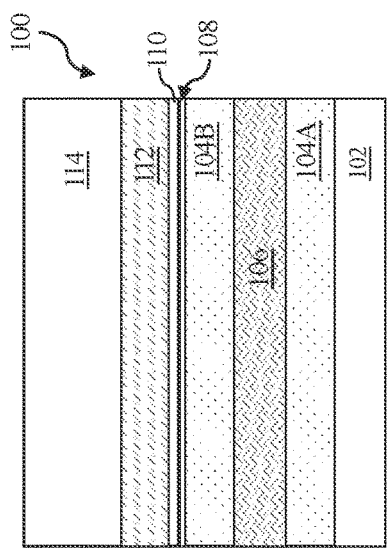
Figure 7B:
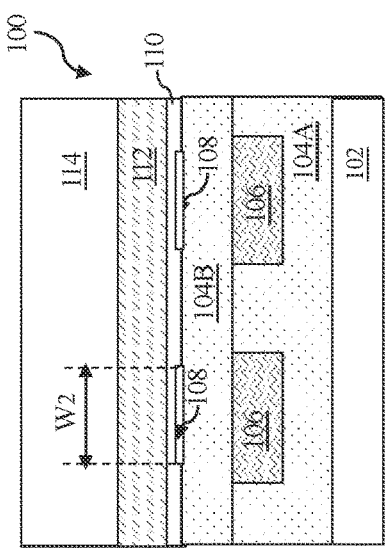
Figure 6A:
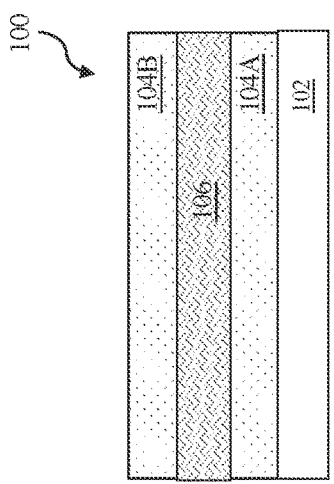
Figure 6B:
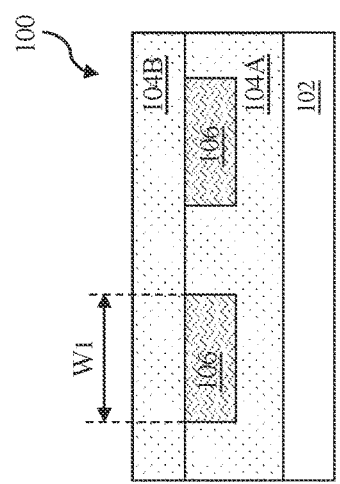

Referring to FIGS. 7A and 7B, the method 200 includes an operation 206 by forming the 2D channel layer 108 on the second dielectric film 104B. The formation of the 2D channel layer 108 includes deposition of the 2D material and patterning the 2D material to form 2D channel layer 108 having various 2D channel members, such as 108N and 108P. The 2D channel members (108N or 108P) are longitudinally oriented along the X direction and are spanned with a width $W_2$ along the Y direction. Especially, in the top view, the channel members are vertically aligned and overlapped with the metal features 106, respectively. In some embodiments, $W_2$ ranges between 5 nm and 100 nm; and $W_1$ is equal to or greater than $W_2$, such as greater by amount from 5 nm to 20 nm. In some embodiments, the ratio $W_1/W_2$ is greater than 1, such as ranging between 1.2 and 1.5.

Still referring to FIGS. 7A and 7B, the method 200 includes an operation 208 by depositing gate materials on the 2D channel layer 108 and the dielectric layer 104. The gate materials include a gate dielectric layer 110; a gate electrode 112 disposed on the gate dielectric layer 110; and may further include a hard mask 114 disposed on the gate electrode 112 and used as an etch mask to pattern the gate materials. The hard mask 114 may be formed by any suitable process, such as CVD. The hard mask 114 includes one or more dielectric material such as silicon oxide, silicon nitride, silicon oxynitride, silico carbon nitride and SiOCN. The hard mask 114 may additionally or alternatively include other suitable material. The hard mask 114 include a thickness ranging between 5 nm and 30 nm according to some examples.

Referring to FIGS. 8A and 8B, the method 200 includes an operation 210 by patterning the gate materials to form gate stacks 116, resulting in trenches 118 among the gate stacks 116. The patterning process includes a lithography process and etching. In the described embodiment, the patterning process includes forming a patterned photoresist layer by a lithography process; performing a first etching process to the hard mask 114 to transfer the openings of the patterned photoresist layer to the hard mask 114; and performing a second etching process to the gate materials to transfer the openings of the hard mask to the gate materials, thereby forming the gate stacks 116.

Referring to FIGS. 9A and 9B, the method 200 includes an operation 212 by forming the gate spacer 120, the CESL 122 and the ILD layer 124 by a suitable procedure. In the described embodiment, the operation 212 includes depositing the gate spacer 120 in the trenches 118 and on sidewalls of the gate stacks 116; depositing the CESL 122 on the gate spacer 120; and depositing the ILD layer 124 on the CESL 122 to fill the trenches 118.

Referring to FIGS. 10A and 10B, the operation 212 further includes a CMP process to remove the excessive deposited materials and planarize the surface.

Referring to FIGS. 11A, 11B, 12A and 12B, the method 200 includes an operation 214 by forming the SAC features 128 on the gate stacks 116. The SAC features 128 are self-aligned with the gate stacks 116 and constrained between the CESL 122. The SAC features 128 include one or more dielectric materials and include a top surface being coplanar with the top surface of the ILD layer 124. In the described embodiment, the formation of the SAC features 128 includes removing the hard mask 114 by etching; and pulling back the gate spacer 120, resulting in trenches 126 in the ILD layer 124, as illustrated in FIGS. 11A and 11B. The pulling-back process includes performing a suitable etching process to selectively etch the gate spacer 120, thereby recessing the gate spacer 120, such as recessing the gate spacer 120 to the height of the gate stacks 116.

In the described embodiment, the formation of the SAC features 128 further includes filling the dielectric material into the trenches 126; and performing a CMP process to the excessive deposited dielectric materials and planarize the surface, thereby forming the SAC features 128 in trenches 126, as illustrated in FIGS. 12A and 12B.

Referring to FIGS. 13A and 13B, the method 200 includes an operation 216 by forming a source trench 130 that passes through the ILD layer 124, the CESL 122, the gate spacer 120, the 2D channel layer 108, and the second dielectric film 104B, and extends down to the metal feature 106. The metal feature 106 is exposed within the source trench 130. The formation of the source trench 130 includes a suitable procedure, such as one procedure that further includes forming a patterned mask 132 by a lithography process; and performing one or more etching process to etch various materials through the opening of the patterned mask 132 until the metal feature 106 is exposed within the source trench 130. In the described embodiment, the patterned photoresist layer is used as the patterned mask 132. Alternatively, a hard mask may be used as the patterned mask 132. The etching process may include plasma etch, wet etch, other suitable etch, or a combination thereof to etch through various material layers. The etching process may include multiple etching steps to etch through different material layers. In the present embodiment, the etching process is designed to be selective relative to other materials, such as the SAC features 128 so that the SAC features and patterned mask 132 collectively function as an etch mask. Therefore, a low-grade photomask may be used in the lithography process. In furtherance of the embodiment, the CESL 122 may also function as the collective etch mask. Only when the source trench 130 reaches the CESL 122, a wet etch or anisotropic etch is applied to open the bottom of the CESL 122. After the formation of the source trench 130, the patterned mask 132 is removed by a suitable process, such as plasma ashing or wet stripping in the present case where the patterned mask 132 is a patterned photoresist layer.

Referring to FIGS. 14A and 14B, the method 200 includes an operation 218 by forming a drain trench 134 that passes through the ILD layer 124, the CESL 122, the gate spacer 120, and the 2D channel layer 108, and extends down to the second dielectric film 104B. The second dielectric film 104B is exposed within the drain trench 134. The formation of the drain trench 134 is similar to that of the source trench 130 except for the drain trench 134 is located at the drain region and is extending down to a different level. Particularly, a patterned mask 136 is formed by a lithography process. The patterned mask 136 covers the source trench 130 and has an opening to expose the drain region. The patterned mask 136 and the SAC features 128 collectively function as an etch mask. After the formation of the drain trench 134, the patterned mask 136 is removed by a suitable process, such as plasma ashing or wet stripping in the present case where the patterned mask 136 is a patterned photoresist layer.

Referring to FIGS. 15A and 15B, the method 200 includes an operation 220 by forming the source contact 138 and the drain contact 140 within the source trench 130 and the drain trench 134, respectively. The source contact 138 is directly landing on the metal feature 106 and is electrically connected to the metal feature 106 while the drain contact 140 is landing on the second dielectric film 104B and is isolated or separated from the metal feature by the dielectric layer 104. The drain contact 140 is not electrically connected to the metal feature 106 since the corresponding transistor (and the 2D channel layer) is normally off. In some embodiments, the formation of the source contact 138 and the drain contact 140 includes depositing a metal or other metal-containing conductive material to fill in the source trench 130 and the drain trench 134 using a suitable deposition method; and performing a CMP process to remove the excessive deposited metal and planarize the surface. Accordingly, the source contact 138 and the drain contact 140 have top surfaces being coplanar, and bottom surfaces at different levels, as illustrated in FIG. 15A. In some embodiments, the source contact 138 and the drain contact 140 each include multiple layers, such as a barrier layer and a bulk metal surrounded by the barrier layer so that the bulk metal is separated from the surrounding dielectric materials by the barrier layer to prevent from the diffusion. In furtherance of the embodiments, the barrier layer may include Ti and TiN, or Ta and TaN; and the bulk metal includes W, Al, Cu, other suitable metal, or a combination thereof. The barrier layer may be deposited by PVD, ALD or other suitable method. The bulk metal may be deposited by PVD, ALD, plating, other suitable method or a combination thereof. For example, the barrier layer is deposited by PVD, and the bulk metal is deposited by PVD to form a seed layer and then plating on the seed layer. The source contact 138 spans a width $W_3$ along the Y direction. The dimensions $W_1$, $W_2$, and $W_3$ are designed to have certain relationships for optimized device performance, which will be further described later according to various embodiments.

The method 200 may further include performing further processes to form the semiconductor device 100 at block 222. The method 200 may include other processing steps implemented before, during and/or after the above operations. For examples, the method 200 includes forming an interconnect structure to couple various device features to a functional circuit. The interconnect structure includes various metal features, such as metal lines and via features to form electrical routings.

Figure 16A:
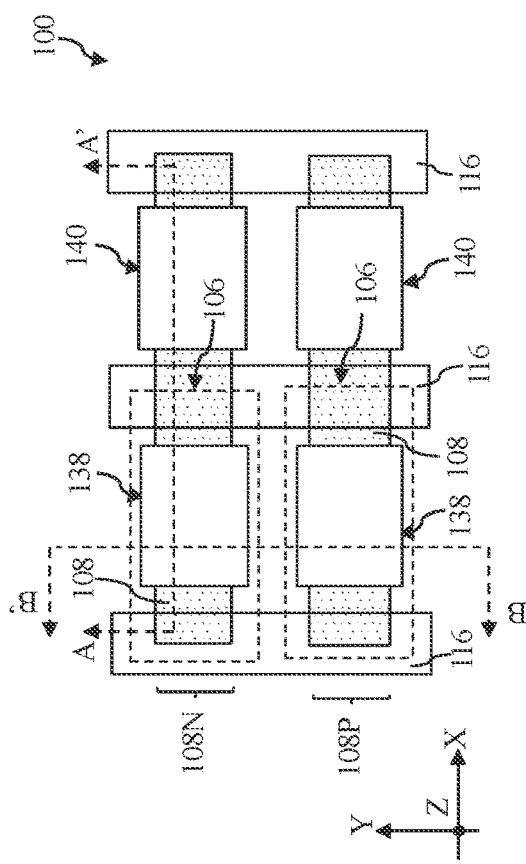
FIG. 16A illustrates a fragmentary top view of a semiconductor device, according to one or more aspects of the present disclosure.
Figure 16C:
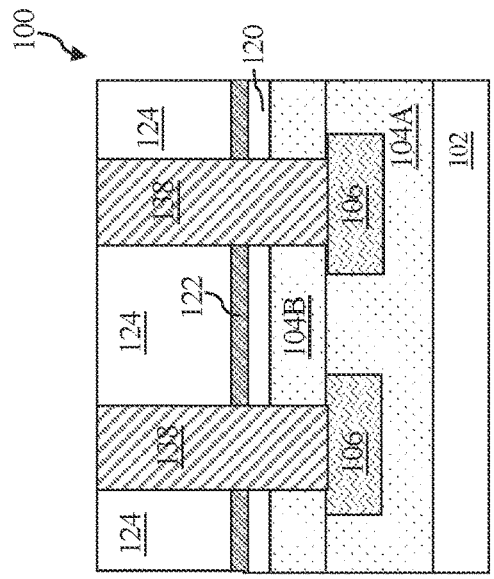
FIGS. 16B and 16C illustrate fragmentary cross-sectional views of a semiconductor device of FIG. 16A along AA' and BB', respectively, according to one or more aspects of the present disclosure.
Figure 16B:
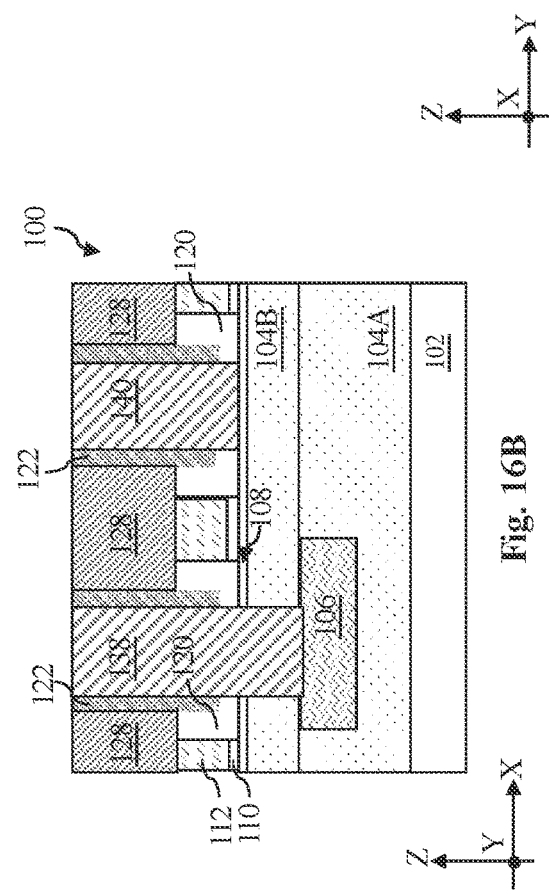

An alternative embodiment of the semiconductor device 100 is illustrated in FIGS. 16A-16C, constructed in accordance with some embodiments. FIG. 16A is a top view of the semiconductor device 100; FIG. 16B is a sectional view of the semiconductor device 100 of FIG. 16A cut along AA'; and FIG. 16C is a sectional view of the semiconductor device 100 of FIG. 16A cut along BB'. In this case, the operation 218 to form the drain trench 134 may be different and the drain trench 134 stops on the 2D channel layer 108 instead of etching through the 2D channel layer 108. In this case, the drain contact 140 is landing on the 2D channel layer 108 and is electrically connected to the 2D channel layer 108.

Another alternative semiconductor device 100 is illustrated in FIGS. 17A-17C, constructed in accordance with some embodiments. FIG. 17A is a top view of the semiconductor device 100; FIG. 17B is a sectional view of the semiconductor device 100 of FIG. 17A cut along AA'; and FIG. 17C is a sectional view of the semiconductor device 100 of FIG. 17A cut along BB'. In the depicted embodiment, the operation 204 to form the metal feature 106 may be different. The metal feature 106 is formed with different dimensions, such as the metal feature 106 horizontally extends along the X direction to a location between the gate stack 116 and the drain contact 140, such as with an edge being overlapped with the CESL 122 in the top view, or alternatively with an edge being aligned with a sidewall of the CESL 122 in the top view.

Another alternative semiconductor device 100 is illustrated in FIGS. 18A-18C, constructed in accordance with some embodiments. FIG. 18A is a top view of the semiconductor device 100; FIG. 18B is a sectional view of the semiconductor device 100 of FIG. 18A cut along AA'; and FIG. 18C is a sectional view of the semiconductor device 100 of FIG. 18A cut along BB'. In the depicted embodiment, the operation 216 to form the source trench 130 may be different and the etching process partially recess the metal feature 106. Therefore, the source trench 130 extends into the metal feature 106 instead of stopping on the metal feature 106. In this case, the source contact 138 is extruded into and partially embedded in the metal feature 106 with increased contact area.

Another alternative semiconductor device 100 is illustrated in FIGS. 19A-19C, constructed in accordance with some embodiments. FIG. 19A is a top view of the semiconductor device 100; FIG. 19B is a sectional view of the semiconductor device 100 of FIG. 19A cut along AA'; and FIG. 19C is a sectional view of the semiconductor device 100 of FIG. 19A cut along BB'. In some alternative embodiments, the operation 216 to form the source trench 130 may be different and the etching process partially recess the dielectric layer 104. Furthermore, the source contact 138 spans, along the Y direction, a dimension $W_3$ along the X direction greater than the dimension $W_1$ of the metal feature 106. Therefore, the source contact 138 is partially extruded into the dielectric layer 104 and disposed on sidewalls of the metal feature 106 with increased contact area.

Another alternative semiconductor device 100 is illustrated in FIGS. 20A-20C, constructed in accordance with some embodiments. FIG. 20A is a top view of the semiconductor device 100; FIG. 20B is a sectional view of the semiconductor device 100 of FIG. 20A cut along AA'; and FIG. 20C is a sectional view of the semiconductor device 100 of FIG. 20A cut along BB'. In this case, the channel members 108 are formed differently at operation 206. For examples, the channel members 108N for nFETs and the channel members 108P for pFETs each include multiple channel members, such as each including "n" channel members. In the illustrated example, the number "n" is 4. However, it is not intended to be limiting and the number "n" can be any suitable number, such as 3, 5, 6, and etc. In the depicted embodiment, the channel members are formed of carbon nanotubes (CNTs). In some examples, the diameter D of each CNTs ranges between 1 nm and 1.5 nm. The spacing S between the adjacent channel members ranges between 1 nm and 1.5 nm. The pitch P=S+D ranges between 2 nm and 3 nm. The ratio P/D ranges between 1.3 and 3.

Figure 21A:
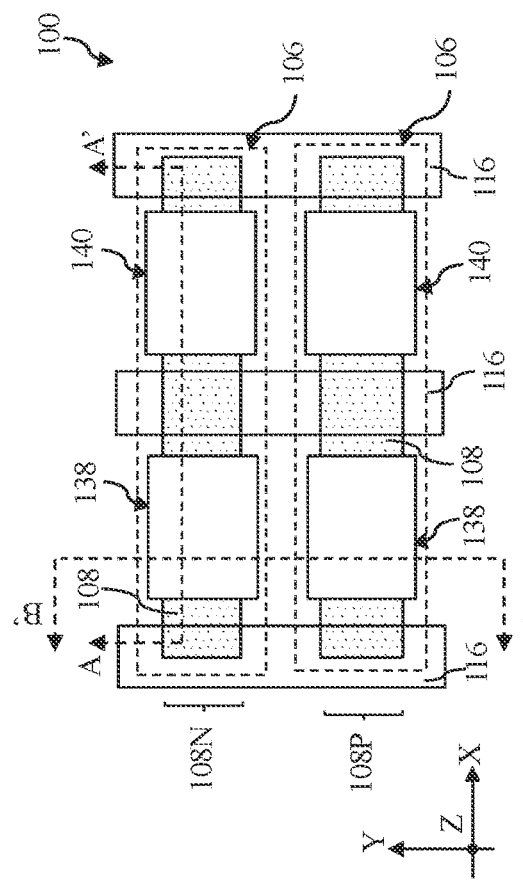
FIG. 21A illustrates a fragmentary top view of a semiconductor device, according to one or more aspects of the present disclosure.

Another alternative semiconductor device 100 is illustrated in FIGS. 21A-22C, constructed in accordance with some embodiments. FIG. 21A is a top view of the semiconductor device 100; FIG. 21B is a sectional view of the semiconductor device 100 of FIG. 21A cut along AA'; and FIG. 21C is a sectional view of the semiconductor device 100 of FIG. 21A cut along BB'. In this case, the source contact 144 is similar to the drain contact 140. Both are vertically extending from the top surface of the ILD layer 124 to the top surface of the 2D channel layer 108. The top surfaces of the source contact 144 and the drain contact 140 are coplanar; and the bottom surfaces of the source contact 144 and the drain contact 140 are coplanar as well. Furthermore, the semiconductor device 100 further includes a conductive feature (or via feature) 142 embedded in the second dielectric film 104B. The via feature 142 vertically spans between the bottom surface of the 2D channel layer 108 and the top surface of the metal feature 106. The via feature 142 is configured to be aligned or overlapped with both the source contact 144 and the metal feature 106 in the top view such that the source contact 144 is electrically connected to the metal feature 106 through the 2D channel layer 108 and the via feature 142. The via feature 142 is similar to the source contact 138 or 144 in terms of the composition, formation and structure. For example, the via feature 142 includes W, Co, Ru, Ti, Ti, TaN, Ta, Al, Mo, other suitable metal-containing conductive material, or a combination thereof. In some examples, the via feature 142 includes multiple layers, such as a barrier layer and bulk metal on the barrier layer. The barrier layer includes Ti/TiN or Ta/TaN. The bulk metal includes W, Co, Ru, Al, Mo, other suitable metal-containing conductive material, or a combination thereof. The formation of the semiconductor device 100 in FIGS. 21A~21C are further described below with reference to FIGS. 22~33B.

Figure 21C:
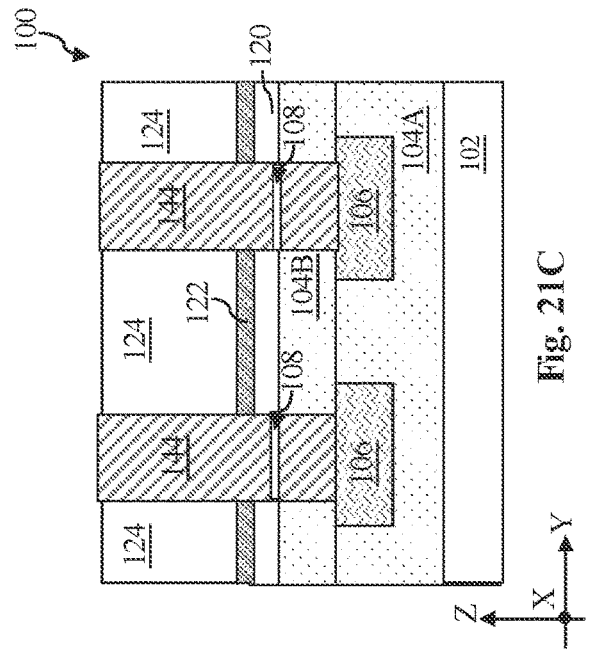
FIGS. 21B and 21C illustrate fragmentary cross-sectional views of a semiconductor device of FIG. 21A along AA' and BB', respectively, according to one or more aspects of the present disclosure.
Figure 21B:
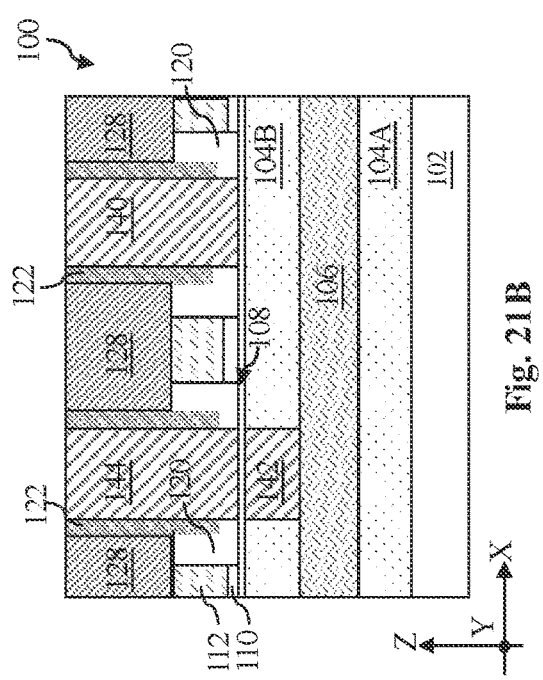
Figure 22:
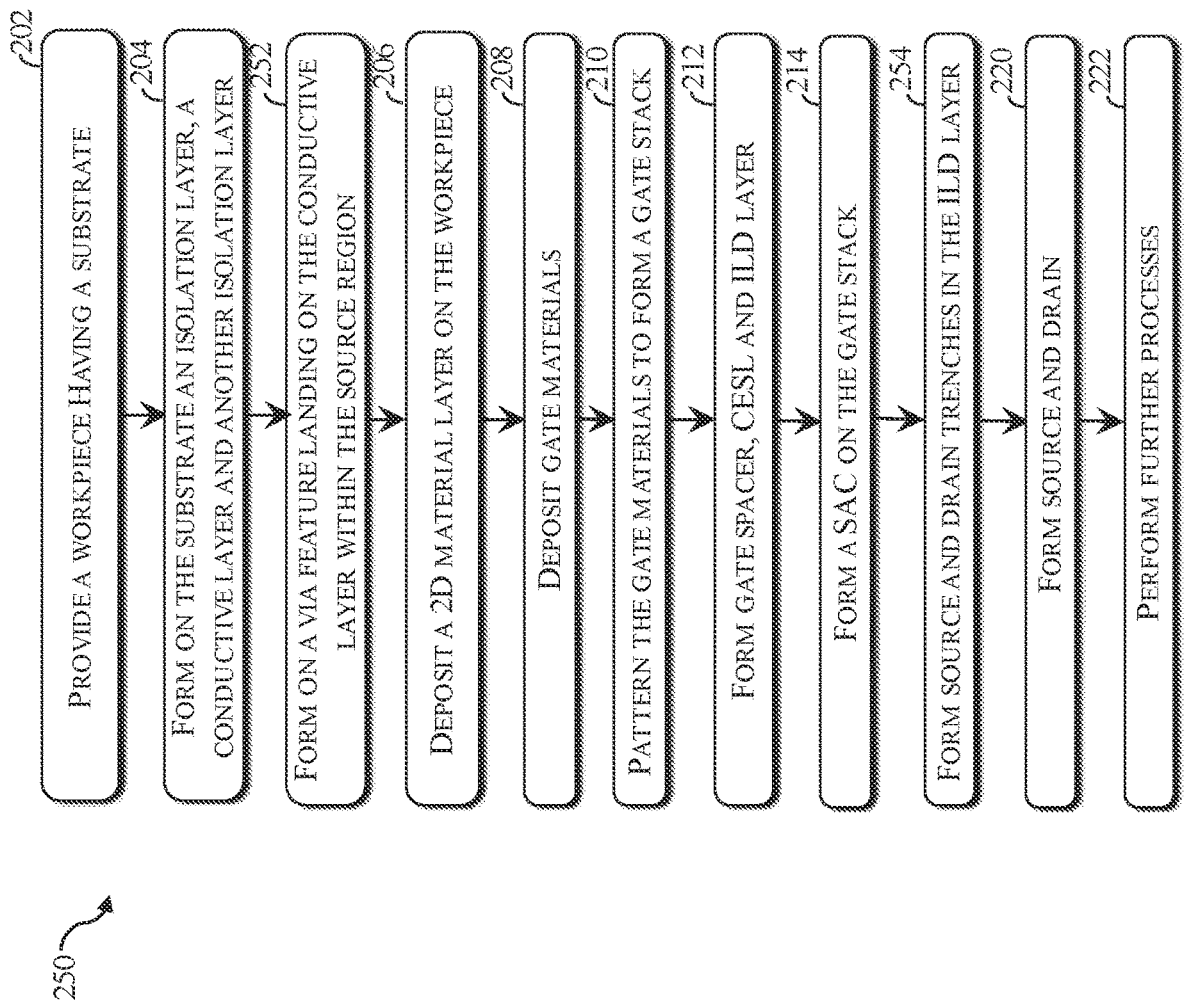
FIG. 22 illustrates a flowchart of a method of fabricating a semiconductor device, according to one or more aspects of the present disclosure.
Figure 23:
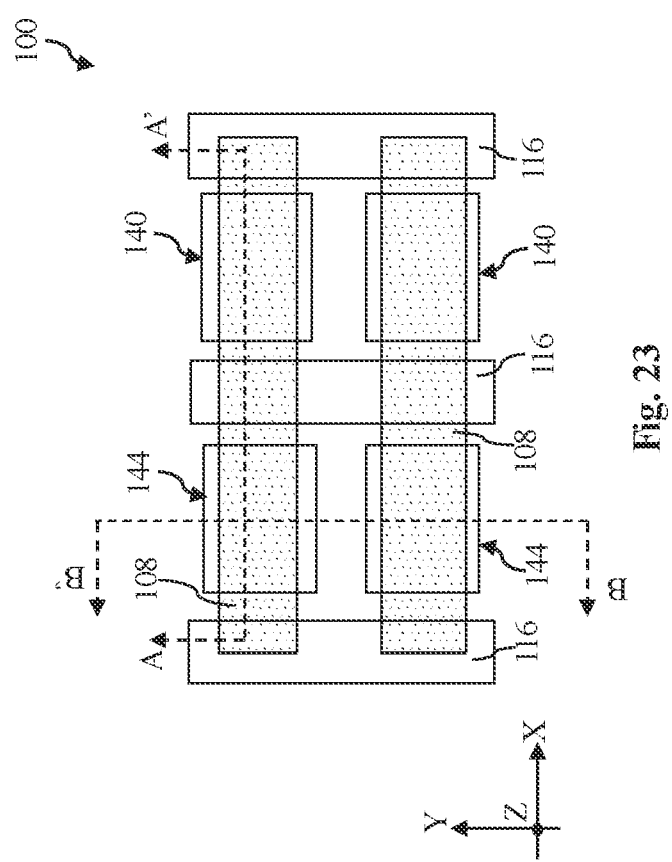
FIG. 23 illustrates a fragmentary top view of a semiconductor device, according to one or more aspects of the present disclosure.

FIG. 22 is a flowchart of a method 250 making the semiconductor device 100 in FIGS. 21A~21C; FIG. 23 is a top view of the semiconductor device 100; FIGS. 24A~33A are sectional views of the semiconductor device 100 cut along AA' of FIG. 23 at various fabrication stages; and FIGS. 24B~33B are sectional views of the semiconductor device 100 cut along BB' of FIG. 23 at various fabrication stages, constructed according to various embodiments.

Figure 24A:
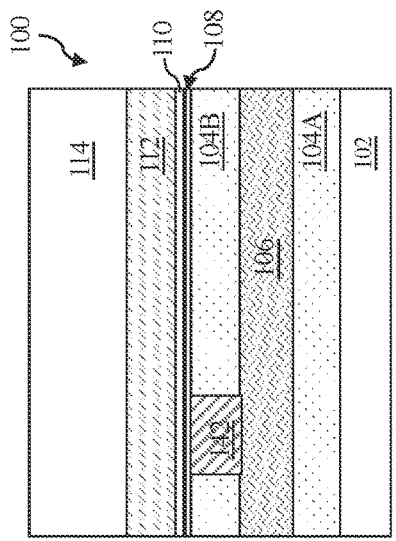
Figure 24B:
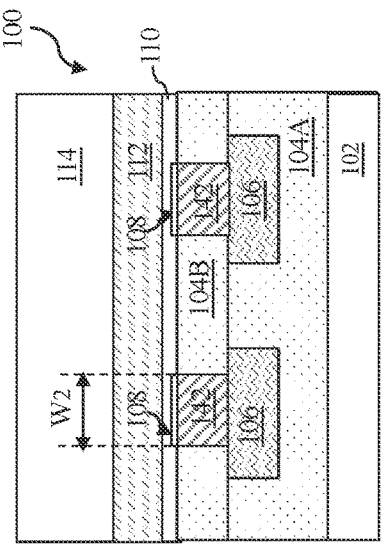

Referring to FIGS. 24A and 24B, the method 250 begins at the block 202 by providing a workpiece 100 having a substrate 102.

Still referring to FIGS. 24A and 24B, the method 250 includes an operation 204 by forming the dielectric layer 104 on the substrate 102 and the metal features 106 embedded in the dielectric layer 104. More particularly, the operation 204 includes depositing the first dielectric film 104A; forming the metal features 106; and forming the second dielectric film 104B on the first dielectric film 104A and the metal features 106. In some embodiments, the formation of the metal features 106 includes a damascene process that further includes patterning the first dielectric film 104A to form trenches; filling the trenches with conductive material(s) to form the metal features 106; and performing a CMP process. The metal features 106 are longitudinally oriented along the X direction and are spanned with a width $W_1$ along the Y direction.

Figure 25A:
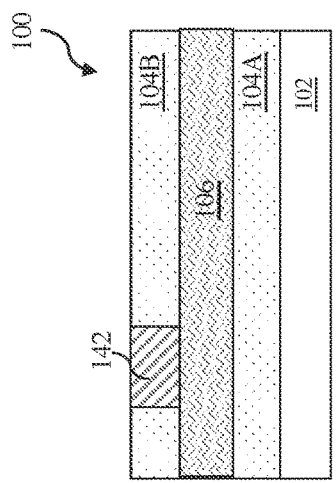
Figure 25B:
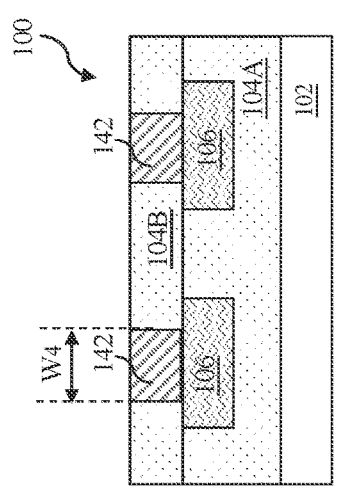

Referring to FIGS. 25A and 25B, the method 250 includes an operation 252 by forming the via feature 142 embedded in the second dielectric film 104B. The via feature spans a dimension $W_4$ along the Y direction. In some embodiments, the formation of the via features 142 includes a damascene process that further includes patterning the second dielectric film 104B to form trenches; filling the trenches with conductive material(s) to form the via features 142; and performing a CMP process.

Figure 26A:
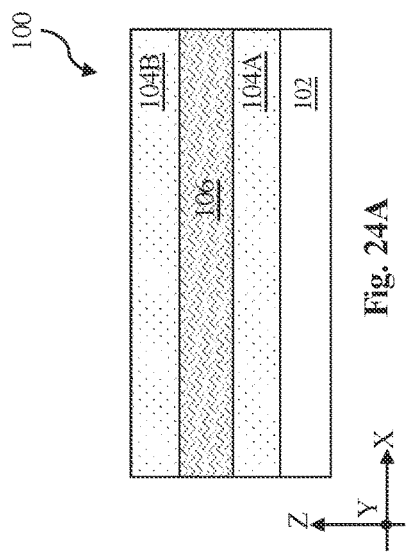
Figure 26B:
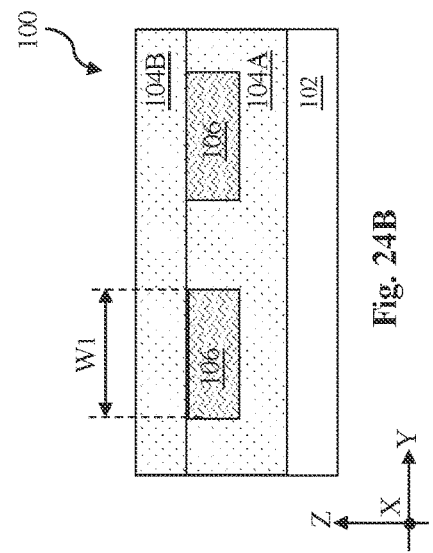

Referring to FIGS. 26A and 26B, the method 250 includes an operation 206 by forming the 2D channel layer 108 on the second dielectric film 104B. The formation of the 2D channel layer 108 includes deposition of the 2D material and patterning the 2D material to form 2D channel layer 108 having various 2D channel members, such as 108N and 108P. The 2D channel members (108N or 108P) are longitudinally oriented along the X direction and are spanned with a width $W_2$ along the Y direction. Especially, in the top view, the channel members are vertically aligned and overlapped with the metal features 106, respectively.

Still referring to FIGS. 26A and 26B, the method 250 includes an operation 208 by depositing gate materials on the 2D channel layer 108 and the dielectric layer 104. The gate materials include a gate dielectric layer 110; a gate electrode 112 disposed on the gate dielectric layer 110; and may further include a hard mask 114 disposed on the gate electrode 112 and used as an etch mask to pattern the gate materials. The hard mask 114 may be formed by any suitable process, such as CVD. The hard mask 114 includes one or more dielectric material such as silicon oxide, silicon nitride, silicon oxynitride, silicon carbon nitride and SiOCN. The hard mask 114 may additionally or alternatively include other suitable material. The hard mask 114 include a thickness ranging between 5 nm and 30 nm according to some examples.

Referring to FIGS. 27A and 27B, the method 250 includes an operation 210 by patterning the gate materials to form gate stacks 116, resulting in trenches 118 among the gate stacks 116. The patterning process includes a lithography process and etching. In the described embodiment, the patterning process includes forming a patterned photoresist layer by a lithography process; performing a first etching process to the hard mask 114 to transfer the openings of the patterned photoresist layer to the hard mask 114; and performing a second etching process to the gate materials to transfer the openings of the hard mask to the gate materials, thereby forming the gate stacks 116.

Referring to FIGS. 28A and 28B, the method 250 includes an operation 212 by forming the gate spacer 120, the CESL 122 and the ILD layer 124 by a suitable procedure. In the described embodiment, the operation 212 includes depositing the gate spacer 120 in the trenches 118 and on sidewalls of the gate stacks 116; depositing the CESL 122 on the gate spacer 120; and depositing the ILD layer 124 on the CESL 122 to fill the trenches 118.

Referring to FIGS. 29A and 29B, the operation 212 further includes a CMP process to remove the excessive deposited materials and planarize the surface.

Referring to FIGS. 30A, 30B, 31A and 31B, the method 250 includes an operation 214 by forming the SAC features 128 on the gate stacks 116. The SAC features 128 are self-aligned with the gate stacks 116 and constrained between the CESL 122. The SAC features 128 include one or more dielectric materials and include a top surface being coplanar with the top surface of the ILD layer 124. In the described embodiment, the formation of the SAC features 128 includes removing the hard mask 114 by etching; and pulling back the gate spacer 120, resulting in trenches 126 in the ILD layer 124, as illustrated in FIGS. 30A and 30B. The pulling-back process includes performing a suitable etching process to selectively etch the gate spacer 120, thereby recessing the gate spacer 120, such as recessing the gate spacer 120 to the height of the gate stacks 116.

In the described embodiment, the formation of the SAC features 128 further includes filling the dielectric material into the trenches 126; and performing a CMP process to the excessive deposited dielectric materials and planarize the surface, thereby forming the SAC features 128 in trenches 126, as illustrated in FIGS. 31A and 31B.

Referring to FIGS. 32A and 32B, the method 250 includes an operation 254 by forming a source trench 146 and a drain trench 134 in the ILD layer 124. The trenches 146 and 134 pass through the ILD layer 124, the CESL 122, and the gate spacer 120, and extends down to the 2D channel layer 108. The 2D channel layer 108 is exposed within the source trench 146 and the drain trench 134. Particularly, the source trench 146 and the drain trench 134 are simultaneously by a same patterning procedure. The formation of the source trench 146 and the drain trench 134 includes a suitable procedure, such as one procedure that further includes forming a patterned mask by a lithography process; and performing one or more etching process to etch various materials through the opening of the patterned mask until the 2D channel layer 108 is exposed within the trenches 146 and 134. In the described embodiment, the patterned photoresist layer is used as the patterned mask. Alternatively, a hard mask may be used as the patterned mask. The etching process may include plasma etch, wet etch, other suitable etch, or a combination thereof to etch through various material layers. The etching process may include multiple etching steps to etch through different material layers. In the present embodiment, the etching process is designed to be selective relative to other materials, such as the SAC features 128 so that the SAC features 128 and patterned mask collectively function as an etch mask. Therefore, a low-grade photomask may be used in the lithography process. In furtherance of the embodiment, the CESL 122 may also function as the collective etch mask. Only when the trenches reach the CESL 122, a wet etch or anisotropic etch is applied to open the bottom of the CESL 122. After the formation of the source trench 146 and the drain trench 134, the patterned mask is removed by a suitable process.

Figure 33A:
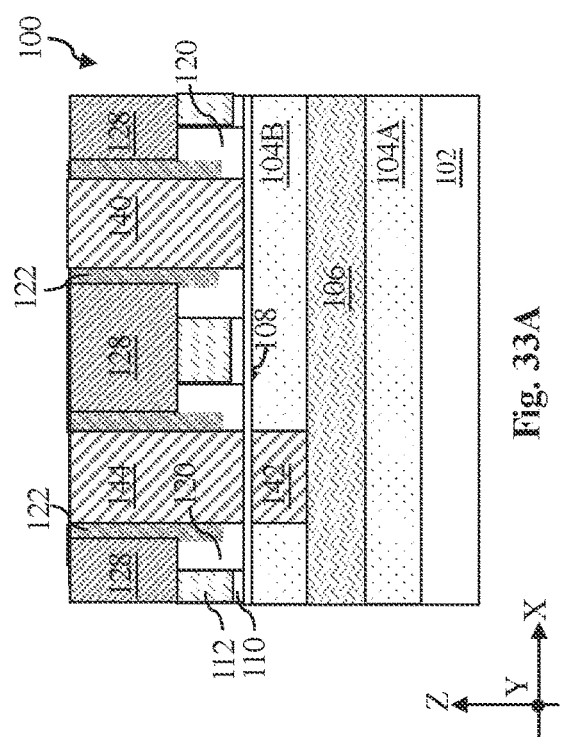
Figure 33B:
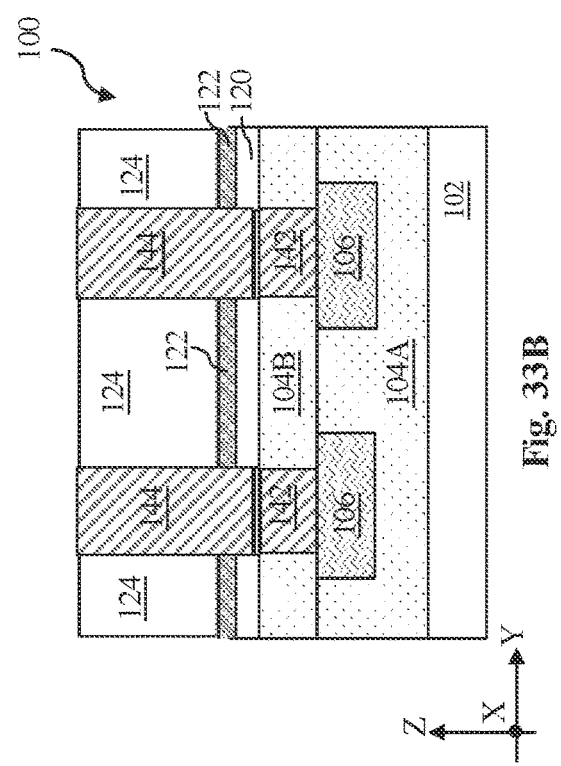

Referring to FIGS. 33A and 33B, the method 250 includes an operation 220 by forming the source contact 144 and the drain contact 140 within the source trench 146 and the drain trench 134, respectively. Both the source contact 144 and the drain contact 140 are directly landing on the 2D channel layer 108. The source contact 144 is landing on and electrically connected to the metal feature 106 while the drain contact 140 is separated from the metal feature 106 by the dielectric layer 104. In some embodiments, the formation of the source contact 144 and the drain contact 140 includes depositing the metal or other metal-containing conductive material to fill in the source trench 146 and the drain trench 134 using a suitable deposition method; and performing a CMP process to remove the excessive deposited metal and planarize the surface. Accordingly, the source contact 144 and the drain contact 140 have top surfaces being coplanar, and bottom surfaces being coplanar as well, as illustrated in FIG. 33A. In some embodiments, the source contact 144 and the drain contact 140 each include multiple layers, such as a barrier layer and a bulk metal surrounded by the barrier layer so that the bulk metal is separated from the surrounding dielectric materials by the barrier layer to prevent from the diffusion. In furtherance of the embodiments, the barrier layer may include Ti and TiN, or Ta and TaN; and the bulk metal includes W, Al, Cu, other suitable metal, or a combination thereof. The barrier layer may be deposited by PVD, ALD or other suitable method. The bulk metal may be deposited by PVD, ALD, plating, other suitable method or a combination thereof. For example, the barrier layer is deposited by PVD, and the bulk metal is deposited by PVD to form a seed layer and then plating on the seed layer.

The method 250 may further include performing further processes to form the semiconductor device 100 at block 222. The method 250 may include other processing steps implemented before, during and/or after the above operations. For examples, the method 250 includes forming an interconnect structure to couple various device features to a functional circuit. The interconnect structure includes various metal features, such as metal lines and via features to form electrical routings.

Figure 34A:
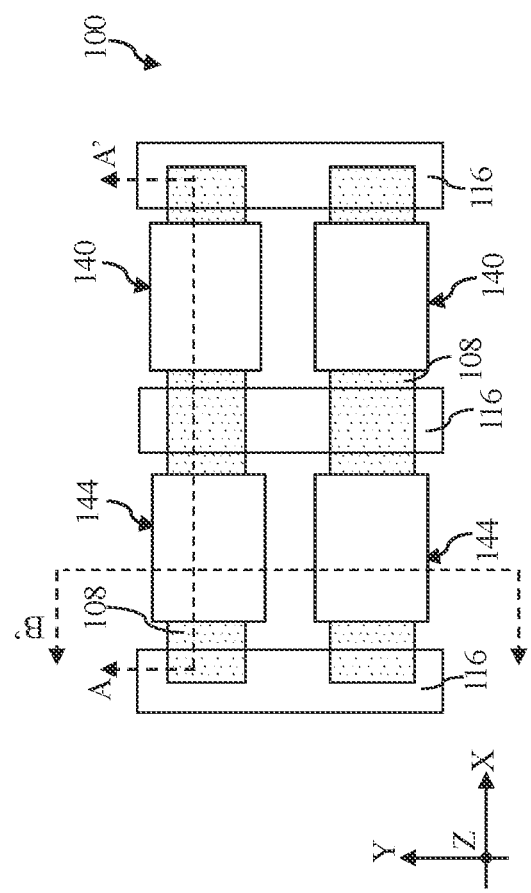
FIG. 34A illustrates a fragmentary top view of a semiconductor device, according to one or more aspects of the present disclosure.
Figure 34C:
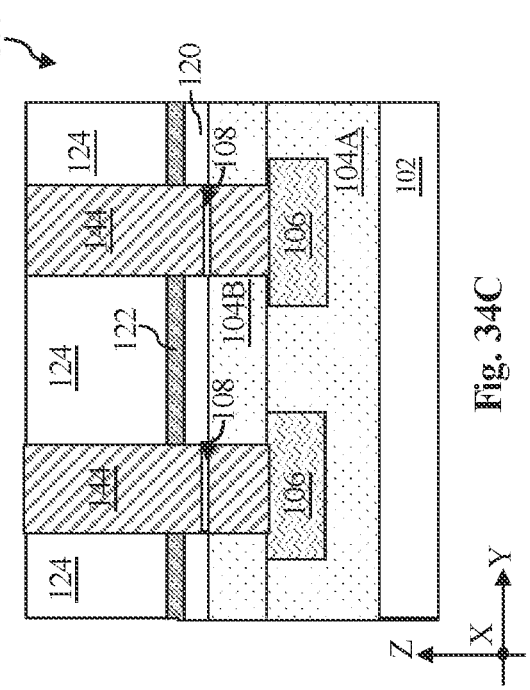
FIGS. 34B and 34C illustrate fragmentary cross-sectional views of a semiconductor device of FIG. 34A along AA' and BB', respectively, according to one or more aspects of the present disclosure.
Figure 34B:
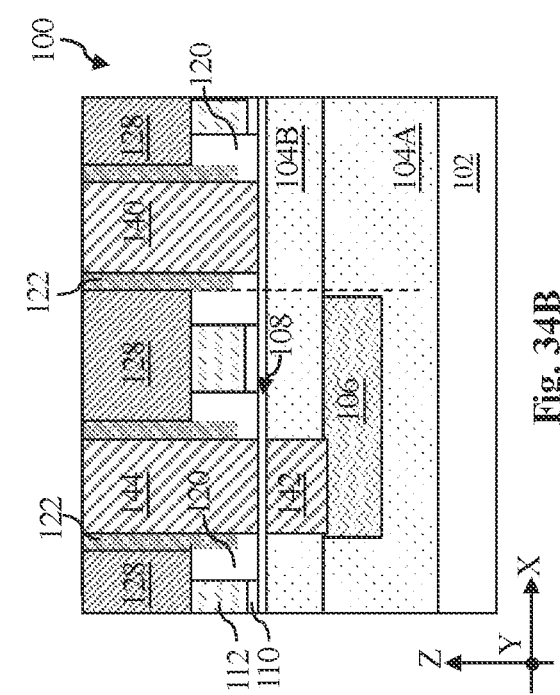

In some alternative embodiments, the metal feature 106 may be formed differently at the operation 204. The metal feature 106 is formed with different dimensions, such as the metal feature 106 horizontally extends along the X direction to a location between the gate stack 116 and the drain contact 140, such as with an edge being overlapped with the gate spacer 120 in the top view, or alternatively being overlapped with the CESL 122 in the top view, such as those illustrated in FIGS. 34A, 34B and 34C. FIG. 34A is a top view of the semiconductor device 100; FIG. 34B is a sectional view of the semiconductor device 100 cut along AA' of FIG. 34A; and FIG. 34C is a sectional view of the semiconductor device 100 cut along BB' of FIG. 34A. Furthermore, the via feature 142 and the source contact 144 spans along the X direction with a same dimension and fully overlapped in the top view. Particularly, edges of the via feature 142 and the edges of the source contact 144 spanning along the X direction are aligned, respectively, in the top view.

Figure 35A:
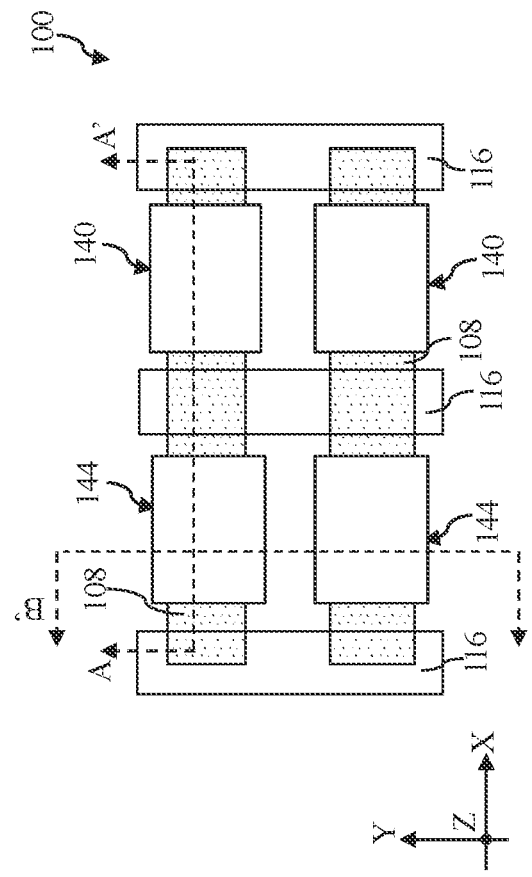
FIG. 35A illustrates a fragmentary top view of a semiconductor device, according to one or more aspects of the present disclosure.
Figure 35C:
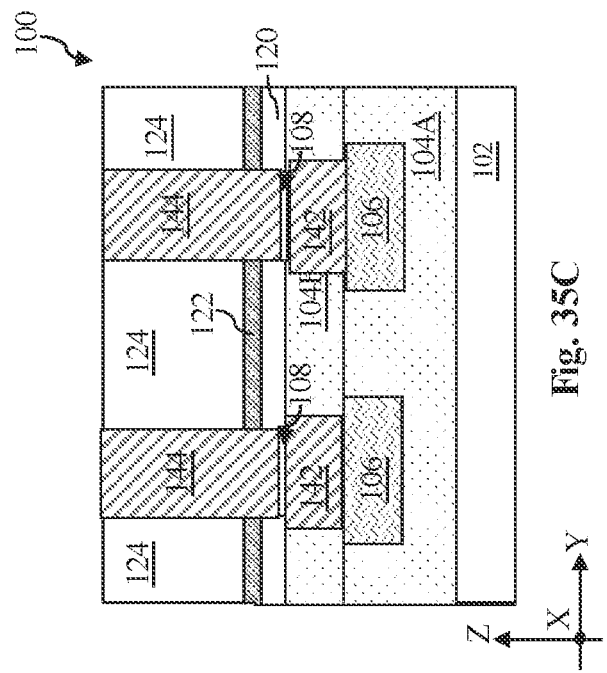
FIGS. 35B and 35C illustrate fragmentary cross-sectional views of a semiconductor device of FIG. 35A along AA' and BB', respectively, according to one or more aspects of the present disclosure.
Figure 35B:
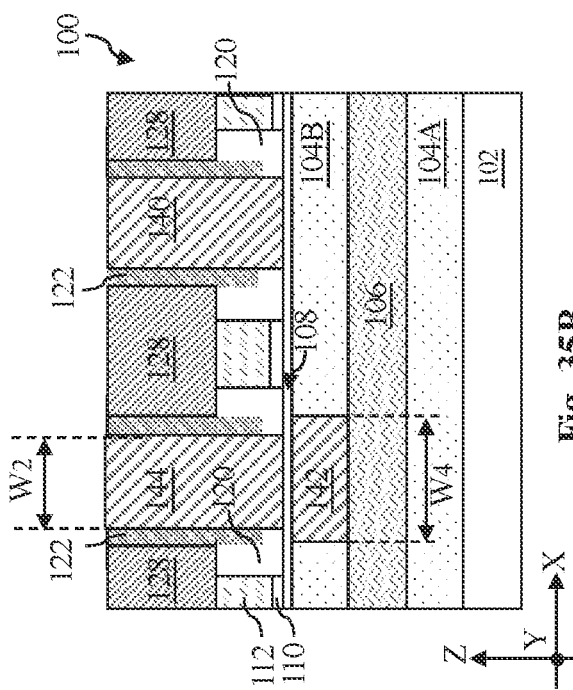

In some alternative embodiments, the via feature 142 and the source contact 144 spans along the X direction with different dimensions and overlapped in the top view. Particularly, the source contact 144 spans along the X direction with a dimension $W_2$ and the via feature 142 spans along the X direction with a dimension less than $W_4$ greater than $W_2$. In some examples, the ratio $W_4/W_2$ ranges between 1.3 and 1.8. The metal feature 106 spans along the X direction such that the source contact 144, the gate stack 116 and the drain contact 140 are all overlapped with the metal feature 106 in the top view, such as those illustrated in FIGS. 35A, 35B and 35C. FIG. 35A is a top view of the semiconductor device 100; FIG. 35B is a sectional view of the semiconductor device 100 cut along AA' of FIG. 35A; and FIG. 35C is a sectional view of the semiconductor device 100 cut along BB' of FIG. 35A.

Figure 36A:
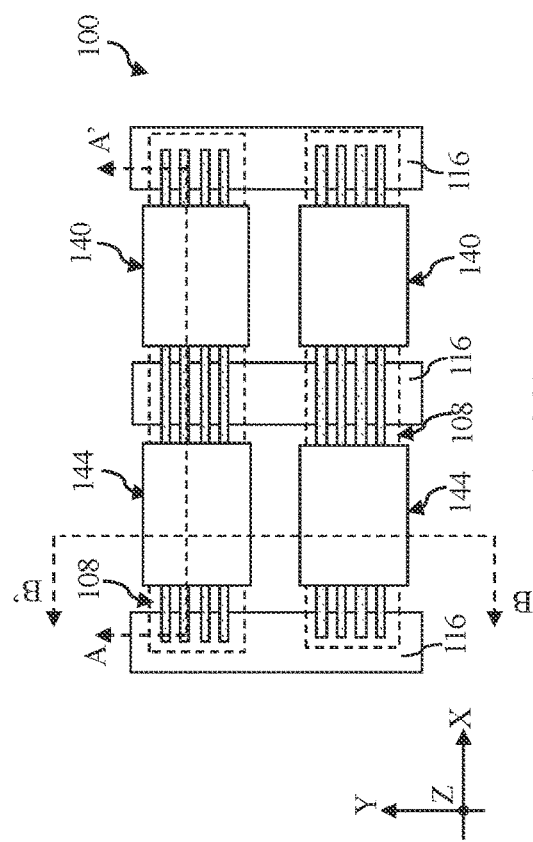
FIG. 36A illustrates a fragmentary top view of a semiconductor device, according to one or more aspects of the present disclosure.
Figure 36C:
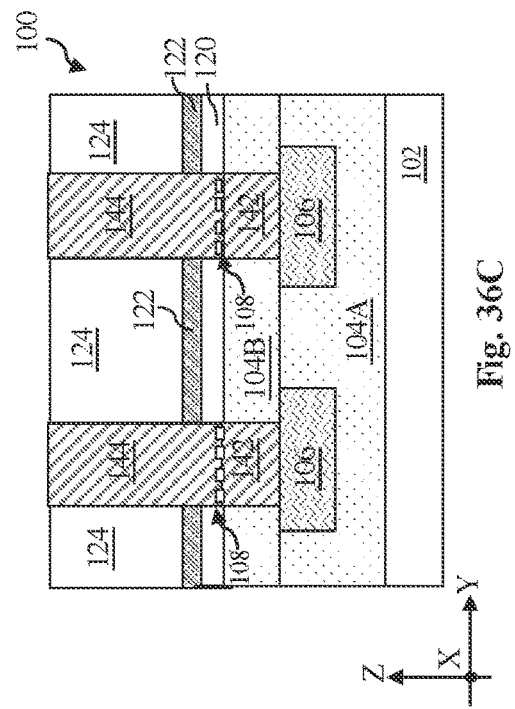
FIGS. 36B and 36C illustrate fragmentary cross-sectional views of a semiconductor device of FIG. 36A along AA' and BB', respectively, according to one or more aspects of the present disclosure.
Figure 36B:
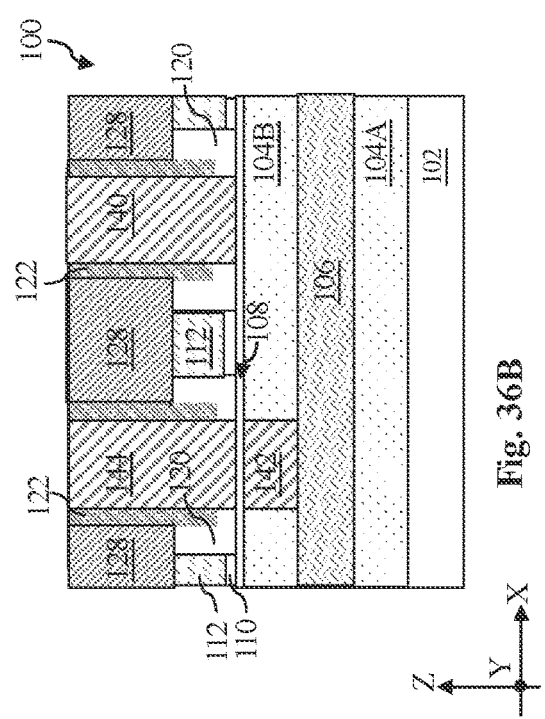

Another alternative semiconductor device 100 is illustrated in FIGS. 36A-36C, constructed in accordance with some embodiments. FIG. 36A is a top view of the semiconductor device 100; FIG. 36B is a sectional view of the semiconductor device 100 of FIG. 36A cut along AA'; and FIG. 36C is a sectional view of the semiconductor device 100 of FIG. 36A cut along BB'. In this case, the channel members 108 are formed differently at operation 206. For examples, the channel members 108N for nFETs and the channel members 108P for pFETs each include multiple channel members, such as each including "n" channel members. In the illustrated example, the number "n" is 4. However, it is not intended to be limiting and the number "n" can be any suitable number, such as 3, 5, 6, and etc. In the depicted embodiment, the channel members are formed of carbon nanotubes (CNTs). In some examples, the diameter D of each CNTs ranges between 1 nm and 1.5 nm. The spacing S between the adjacent channel members ranges between 1 nm and 1.5 nm. The pitch P=S+D ranges between 2 nm and 3 nm. The ratio P/D ranges between 1.3 and 3.

The semiconductor device 100 may have planar structure, or alternatively three-dimensional structure having multi-gate devices. The multi-gate devices are constructed to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

The present disclosure is directed to a semiconductor device. The semiconductor device includes a field-effect transistor with a 2D channel layer disposed on a dielectric layer and the asymmetric substrate contact. The semiconductor device includes a gate stack disposed on the channel layer; a source contact and drain contact disposed on opposite sides of the gate stack. Particularly, the source contact and drain contact are designed asymmetrically. The source contact is vertically extending down to a metal feature embedded in the dielectric layer while the drain contact is separated from the embedded metal feature by the dielectric layer. Alternatively, the source contact is electrically connected to the embedded metal feature through the 2D channel layer and a via feature, which is embedded in the dielectric layer and vertically extending to from the channel layer to the embedded metal feature while the drain contact is separated from the embedded metal feature by the dielectric layer. By utilizing the disclosed semiconductor device, the electric field coupling from the side of the drain contact to the gate stack is redistributed to the source contact or terminated due to the embedded metal feature and its connection to the source contact, thereby reducing drain to gate coupling and improving short channel effect. The semiconductor device also effectively prevents the channel leakage to the metal feature since the metal feature is embedded in the dielectric layer and is isolated from the 2D channel layer by the dielectric layer.

In one example aspect, the present disclosure provides a method that includes providing a workpiece having a semiconductor structure; depositing a two-dimensional (2D) material layer over the semiconductor structure; forming a source feature and a drain feature electrically connected to the semiconductor structure and the 2D material layer, wherein the source feature and drain feature include a semiconductor material; and forming a gate structure over the two-dimensional material layer and interposed between the source feature and the drain feature. The gate structure, the source feature, the drain feature, the semiconductor structure and the 2D material layer are configured to form a field-effect transistor. The semiconductor structure and the 2D material layer function, respectively, as a first channel and a second channel between the source feature and the drain feature.

In another example aspect, the present disclosure provides a semiconductor structure that includes a first dielectric film on a semiconductor substrate; a metal feature embedded in the first dielectric film; a second dielectric film on the first dielectric film and the metal feature; a via feature embedded in the second dielectric film and landing on the metal feature; a channel layer of 2-dimensional (2D) material or carbon nanotube (CNT) disposed on the second dielectric film; a gate stack disposed on the channel layer; and a source contact and a drain contact disposed on both sides of the gate stack and landing on the channel layer. The source contact overlaps with the via feature and the metal feature in a top view, the drain contact is distanced away from the via feature in the top view, and the source contact is isolated from the semiconductor substrate by the first dielectric film.

In another example aspect, the present disclosure provides a method that includes depositing a first dielectric film on a semiconductor substrate; forming a metal feature embedded in the dielectric film; depositing a second dielectric film on the metal feature and the first dielectric film; forming a via feature in the second dielectric film and landing on the metal feature; depositing a channel layer of 2D material or carbon nanotube (CNT) on the second dielectric film and the via feature; forming a gate stack on the channel layer; and forming a source contact and a drain contact landing to the channel layer such that the source contact is overlapped with the via feature and the drain contact is distanced away from the via feature in a top view, wherein the source contact is isolated from the semiconductor substrate contact feature by the dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a dielectric layer on a semiconductor substrate;
   a conductive feature embedded in the dielectric layer;
   a channel layer of 2-dimensional (2D) material or carbon nanotube (CNT) disposed on the dielectric layer;
   a gate stack disposed on the channel layer;
   a via feature disposed on the conductive feature and underlying the channel layer;
   a source contact disposed on one side of the gate stack and on the channel layer such that the channel layer is sandwiched between the source contact and the via feature; and
   a drain contact disposed on an opposite side of the gate stack, wherein the source contact, the channel layer and the via feature electrically connects to the conductive feature, and wherein the drain contact extends to the channel layer and is isolated from the conductive feature by the dielectric layer.

2. The semiconductor structure of claim 1, wherein the channel layer includes multiple channel members and wherein the source contact contacts each of the multiple channel members.

3. The semiconductor structure of claim 2, wherein
the multiple channel members include a spacing S among adjacent two of the multiple channel members along the second direction;
each of the multiple channel members includes a dimension D;
a ratio of (S+D)/D ranges between 1.3 and 3; and
a number of the multiple channel members is equal to or greater than 3.

4. The semiconductor structure of claim 1, wherein
the dielectric layer includes a first dielectric film and a second dielectric film sandwiched the conductive feature; and
the source contact is isolated from the semiconductor substrate by the first dielectric film.

5. The semiconductor structure of claim 1, wherein the via feature source contact extends into the conductive feature.

6. The semiconductor structure of claim 1, wherein the source contact and the drain contact include coplanar top surfaces.

7. The semiconductor structure of claim 1, wherein
the gate stack spans between a first edge and a second edge;
the first edge is adjacent to the source contact and the second edge is adjacent to the drain contact; and
the conductive feature laterally extends to the second edge of the gate stack.

8. The semiconductor structure of claim 7, wherein the conductive feature includes an edge being aligned with the second edge of the gate stack.

9. The semiconductor structure of claim 1, wherein
the channel layer longitudinally extends along a first direction;
the gate stack longitudinally extends along a second direction that substantially orthogonal to the first direction;
the source contact extends a first width along the first direction;
the via feature extends a second width along the first direction; and
the second width is less than the first width.

10. The semiconductor structure of claim 1, wherein each of the conductive feature, the source contact, and the drain contact includes at least one metal selected from tungsten (W), cobalt (Co), ruthenium (Ru), titanium (Ti), tantalum (Ta) and aluminum (Al).

11. The semiconductor structure of claim 1, further comprising:
an etch stop layer of a first dielectric material disposed on the channel layer;
an interlayer dielectric layer of a second dielectric material disposed on the etch stop layer; and
a self-aligned cap layer of a third dielectric material formed on a top of the gate stack and spanning between two edges contacting sidewalls of the etch stop layer, wherein the first, second and third dielectric materials are different from each in composition.

12. The semiconductor structure of claim 11, wherein
the first dielectric material includes one of silicon oxide and silicon nitride;
the second dielectric material includes one of undoped silica glass (USG), phosphosilicate glass (PSG), boron-doped phosphosilicate glass (BPSG), borosilicate glass (BSG);
the first dielectric material includes one of silicon nitride, aluminum oxide, silicon carbide, hafnium oxide, zirconium oxide; and
the self-aligned cap layer, the etch stop layer and the interlayer dielectric layer include a coplanar top surface.

13. A semiconductor structure comprising:
a first dielectric film on a semiconductor substrate;
a metal feature embedded in the first dielectric film;
a second dielectric film on the first dielectric film and the metal feature;
a via feature embedded in the second dielectric film and landing on the metal feature;
a channel layer of 2-dimensional (2D) material or carbon nanotube (CNT) disposed on the second dielectric film;
a gate stack disposed on the channel layer; and
a source contact and a drain contact disposed on both sides of the gate stack and landing on the channel layer, wherein
the channel layer is inserted between the source contact and the via feature,
the source contact overlaps with the via feature and the metal feature in a top view,
the drain contact is distanced away from the via feature in the top view, and
the source contact is isolated from the semiconductor substrate by the first dielectric film.

14. The semiconductor structure of claim 13, wherein
the source contact includes a top surface and a bottom surface; and
the drain contact includes a top surface being coplanar with the top surface of the source contact and a bottom surface being coplanar with the bottom surface of the source contact.

15. The semiconductor structure of claim 13, wherein
the channel layer is longitudinally oriented along a first direction;
the gate stack is longitudinally oriented along a second direction being orthogonal to the first direction;
the source contact spans a first dimension along the first direction;
the via feature spans a second dimension along the first direction;
the metal feature spans a third dimension along the first direction;
the second dimension is greater than the first dimension; and
the third dimension is greater than each of the first and second dimensions.

16. The semiconductor structure of claim 15, wherein
the gate stack spans between a first edge and a second edge along the first direction; and
the metal feature laterally extends from the via feature to the first edge and further extends to the second edge of the gate stack.

17. The semiconductor structure of claim 16, further comprising:
an etch stop layer of a first dielectric material disposed on the channel layer;
an interlayer dielectric layer of a second dielectric material disposed on the etch stop layer; and
a self-aligned cap layer formed of a third dielectric material on a top of the gate stack and spanning between two edges contacting sidewalls of the etch stop layer, wherein the first, second and third dielectric materials are different from each in composition.

18. The semiconductor structure of claim 13, wherein
the channel layer includes multiple channel members; and
the source contact contacts each of the multiple channel members.

19. A semiconductor structure comprising:
a first dielectric layer on a semiconductor substrate;
a conductive feature on the first dielectric layer;
a second dielectric layer on the conductive feature such that the conductive feature is sandwiched between the first and second dielectric layer;
a via feature embedded in the second dielectric layer;
a channel layer of 2-dimensional (2D) material or carbon nanotube (CNT) disposed on the second dielectric layer;
a gate stack disposed on the channel layer; and
a source contact and a drain contact disposed on both sides of the gate stack, wherein the channel layer is inserted between the via feature and the source contact, wherein the conductive feature is electrically connected to the conductive feature through the channel layer and the via feature, and wherein the drain contact extends to the channel layer and is isolated from the conductive feature by the second dielectric layer.

20. The semiconductor structure of claim 19, wherein the channel layer includes multiple channel members; and the source contact contacts each of the multiple channel members.

* * * * *